(12) United States Patent
Van Der Post et al.

(10) Patent No.: US 10,725,381 B2
(45) Date of Patent: Jul. 28, 2020

(54) OPTICAL SYSTEMS, METROLOGY APPARATUS AND ASSOCIATED METHOD

(71) Applicant: ASML Netherlands B.V., Veldhoven (NL)

(72) Inventors: Sietse Thijmen Van Der Post, Utrecht (NL); Stefan Michael Bruno Bäumer, Valkenswaard (NL); Peter Danny Van Voorst, Nijmegen (NL); Teunis Willem Tukker, Eindhoven (NL); Ferry Zijp, Nuenen (NL); Han-Kwang Nienhuys, Utrecht (NL); Jacobus Maria Antonius Van Den Eerenbeemd, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 43 days.

(21) Appl. No.: 16/117,589

(22) Filed: Aug. 30, 2018

(65) Prior Publication Data

US 2019/0072853 A1    Mar. 7, 2019

(30) Foreign Application Priority Data

Sep. 1, 2017   (EP) .................................... 17188979
May 17, 2018   (EP) .................................... 18172804

(51) Int. Cl.
*G21K 1/00*    (2006.01)
*G03F 7/20*    (2006.01)
(Continued)

(52) U.S. Cl.
CPC ....... *G03F 7/2008* (2013.01); *G01N 21/4788* (2013.01); *G01N 21/9501* (2013.01);
(Continued)

(58) Field of Classification Search
CPC .. G03F 7/2008; G03F 7/2039; G03F 7/70158; G03F 7/70033; G03F 7/70641;
(Continued)

(56) References Cited

U.S. PATENT DOCUMENTS 6,952,253 B2   10/2005   Lof et al.
7,701,577 B2   4/2010    Straaijer et al.
(Continued)

FOREIGN PATENT DOCUMENTS

EP          1628164 A2     2/2006
WO     WO 2011/012624 A1   2/2011

OTHER PUBLICATIONS

Bayer et al., "Compact EUV source and optics for applications apart from Lithography," 2006, Proceeding of SPIE, vol. 6317, pp. 631706-1 to 631706-12. (Year: 2006).*

(Continued)

*Primary Examiner* — Kiho Kim
(74) *Attorney, Agent, or Firm* — Sterne, Kessler, Goldstein & Fox P.L.L.C.

(57) ABSTRACT

An optical system (OS) for focusing a beam of radiation (B) on a region of interest in a metrology apparatus is described. The beam of radiation (B) comprises radiation in a soft X-ray or Extreme Ultraviolet spectral range. The optical system (OS) comprises a first stage (S1) for focusing the beam of radiation at an intermediate focus region. The optical system (OS) comprises a second stage (S2) for focusing the beam of radiation from the intermediate focus region onto the region of interest. The first and second stages each comprise a Kirkpatrick-Baez reflector combination. At least one reflector comprises an aberration-correcting reflector.

15 Claims, 11 Drawing Sheets

(51) Int. Cl.
*G21K 7/00* (2006.01)
*G21K 1/06* (2006.01)
*G02B 17/04* (2006.01)
*G01N 21/47* (2006.01)
*G01N 21/95* (2006.01)

(52) U.S. Cl.
CPC .......... *G02B 17/04* (2013.01); *G03F 7/2039* (2013.01); *G03F 7/70033* (2013.01); *G03F 7/70158* (2013.01); *G03F 7/70641* (2013.01); *G21K 1/062* (2013.01); *G21K 1/067* (2013.01); *G21K 7/00* (2013.01); *G21K 2201/064* (2013.01); *G21K 2201/067* (2013.01)

(58) Field of Classification Search
CPC .......... G21K 7/00; G21K 1/067; G21K 1/062; G21K 2201/067; G21K 2201/064; G02B 17/04; G01N 21/4788; G01N 21/9501
See application file for complete search history.

(56) References Cited

U.S. PATENT DOCUMENTS

| | | | |
|---|---|---|---|
| 7,791,724 | B2 | 9/2010 | Den Boef et al. |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 2007/0224518 | A1 | 9/2007 | Yokhin et al. |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2013/0162996 | A1 | 6/2013 | Straaijer et al. |
| 2013/0304424 | A1 | 11/2013 | Bakeman et al. |
| 2013/0329861 | A1* | 12/2013 | Jiang .................... G21K 1/067 378/148 |
| 2014/0019097 | A1 | 1/2014 | Bakeman et al. |
| 2016/0161863 | A1 | 6/2016 | Den Boef et al. |
| 2016/0270200 | A1* | 9/2016 | Hosler .................... H05G 2/00 |
| 2016/0370717 | A1 | 12/2016 | Den Boef et al. |

OTHER PUBLICATIONS

Mimura et al., "Generation of 1020 WCM-2 hard x-ray laser pulses with two-stage reflective focusing system," 2014, Nature Communications, 5:3539, DOI:10.1038/ncomms4539, pp. 1-5. (Year: 2014).*

International Search Report and Written Opinion of the International Searching Authority directed to related International Patent Application No. PCT/EP2018/072432, dated Jan. 28, 2019; 14 pages.

P. Lemaillet et al., "Intercomparison between optical and x-ray scatterometry measurements of FinFET structures," Metrology, Inspection, and Process Control for Microlithography XXVII, Apr. 8, 2013; 8 pages.

Wolter, A., "Mirror systems with grazing incidence as image-forming optics for x-rays", (Leipzig), Ser. 6, vol. 10, (1952) pp. 94-114; with attached English-language translation.

Resta et al., "Nested KirkPatrick-Baez (Montel) optics for hard x-rays", J. Appl. Cryst., vol. 48, (2015) pp. 558-564.

Kodama et al., "Development of an advanced KirkPatrick-Baez microscope", Optics Letters vol. 21, Issue 17, (1996) pp. 1321-1323.

Matsuyama et al., "Hard x-ray imaging optics based on four aspherical mirrors with 50 nm resolution", Optics Express, vol. 20, Issue 9, (2012) pp. 10310-10319.

Definition of "X-Ray Telescope", Wikipedia, accessed Mar. 6, 2018, last updated May 20, 2018; 8 pages.

Communication Relating to the Results of the Partial International Search directed to related International Patent Application No. PCT/EP2018/072432, received Jan. 29, 2018; 2 pages.

Motoyama et al., "Optical design of a sub-1-pm focusing system for soft x-ray free electron lasers," Proceedings of SPIE, vol. 10386, Advances in X-Ray/EUV Optics and Components XII, Sep. 6, 2017; 6 pages.

Giulietti et al., "R&D on High Energy Photonics at the Intense Irradiation Laboratory," Proceedings of SPIE, vol. 5974, International Conference on Charged and Neutral Particles Channeling Phenomena, 2005; pp. 1-14.

Goto et al., "Size-changeable X-ray beam collimation using an adaptive X-ray optical system based on four deformable mirrors," Proceedings of SPIE, vol. 9965, Adaptive X-Ray Optics IV, 2016; pp. 1-9.

Khakurel et al., "Generation of apodized X-ray illumination and its application to scanning and diffraction microscopy," Journal of Synchrotron Radiation, vol. 24, Part 1, Jan. 2017; 9 pages.

* cited by examiner

Single Ellipsoid

2 Paraboloids

Kirkpatrick-Baez (KB)

Wolter:
Ellipsoid + Hyperboloid

Single elliptic-cylindrical

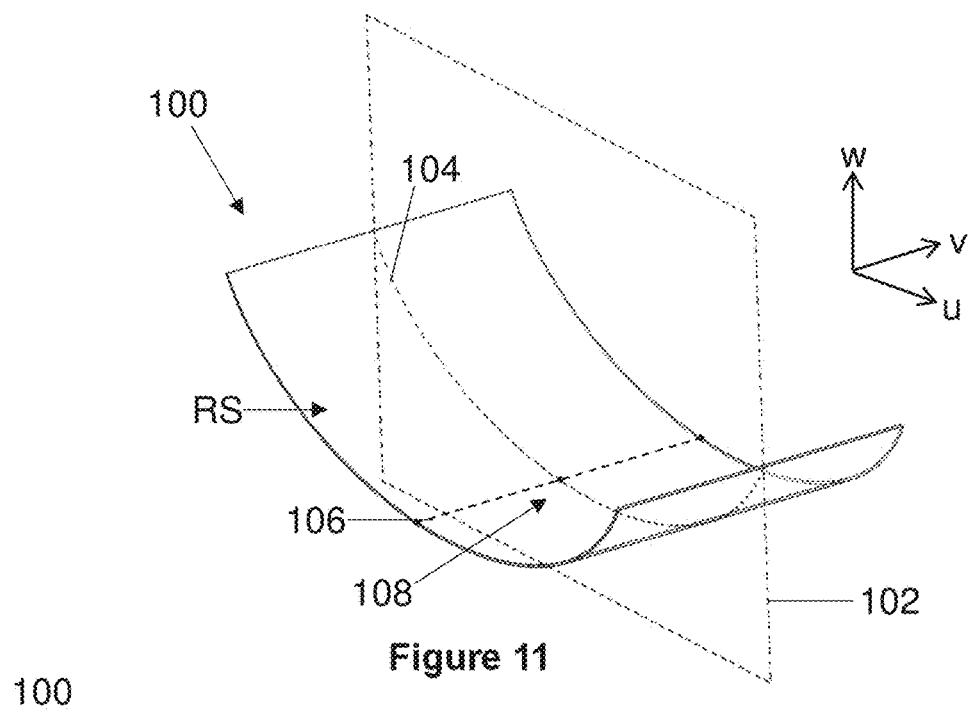
Figure 11
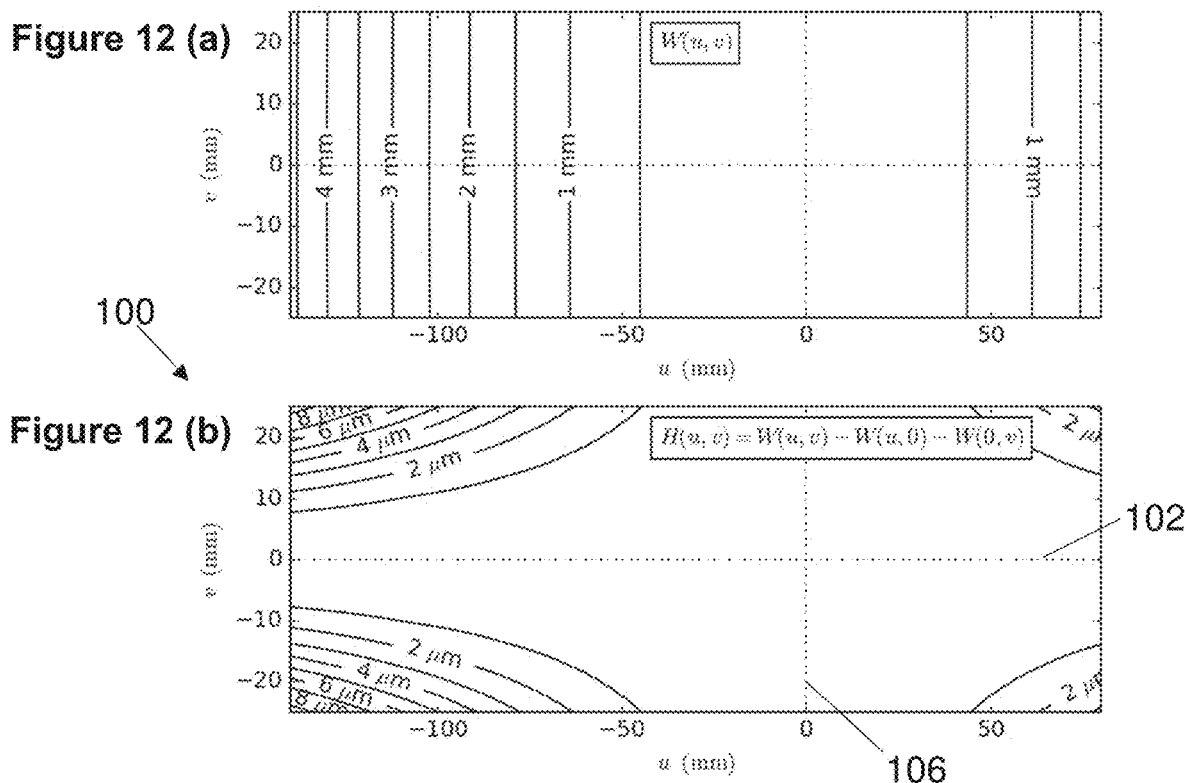
Figure 12 (a)
Figure 12 (b)

OPTICAL SYSTEMS, METROLOGY APPARATUS AND ASSOCIATED METHOD

FIELD

The present invention relates to an optical system and associated methods for, but not exclusively, a metrology apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-k1 lithography may be used to process features with dimensions smaller than the classical resolution limit of a lithographic apparatus. In such process, the resolution formula may be expressed as CD=k1 ×λ/NA, where λ is the wavelength of radiation employed, NA is the numerical aperture of the projection optics in the lithographic apparatus, CD is the "critical dimension" (generally the smallest feature size printed, but in this case half-pitch) and k1 is an empirical resolution factor. In general, the smaller k1 the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

A metrology apparatus, or an inspection apparatus, may be used to determine characteristics of the pattern manufactured on the substrate by the lithographic apparatus. Today many forms of optical metrology technologies are known and with shrinking critical dimensions in the manufactured patterns, these optical metrology technologies may lack resolution. An option is to use in such a metrology apparatus a radiation that has relatively low wavelengths, for example, in the soft X-ray or Extreme Ultraviolet (EUV) spectral range. The relatively low wavelengths may be in the range from 0.1 nm to 100 nm, or in the range from 1 nm to 50 nm, or in the range from 10 nm to 20 nm. One may generate radiation in such wavelengths by using the principle of Higher Harmonic Generation (HHG): short pulses of infrared (IR) radiation are focused in a HHG medium (for example a specific gas) and the HHG medium converts a portion of the received IR radiation towards soft X-ray or EUV radiation. The radiation that is generated by HHG may comprise multiple peaks at different wavelengths in a relatively broad spectrum.

In the metrology apparatus a beam of radiation is directed by an illumination sub-system towards a region of interest on the substrate. At the region of interest is provided, for example, a target. Preferably the beam of radiation is focused on the region of interest or the target.

In the field of satellites and synchrotrons, a few optical systems are known that are capable of focusing broadband radiation in the soft X-ray and/or EUV spectral range on a sensor. Often reflectors are used for reflecting radiation in the soft X-ray and EUV spectral ranges.

SUMMARY

According to an aspect or embodiment, there is provided an optical system for focusing a beam of radiation on a region of interest in a metrology apparatus. The beam of radiation may comprise radiation in a soft X-ray or Extreme Ultraviolet spectral range. The optical system may comprise a first stage for focusing the beam of radiation at an intermediate focus region. The optical system may comprise a second stage for focusing the beam of radiation from the intermediate focus region onto the region of interest. The second stage may comprise a Kirkpatrick-Baez reflector combination.

In use, the optical system may function to provide an imaging system for imaging an apparent point source onto a region of interest such as a target for a metrology apparatus. The inventors have put substantial effort into identifying examples of advantageous optical systems that fulfil certain criteria based on certain boundary conditions. For example, there may be certain criteria to fulfil in terms of the properties of the beam of radiation focused on the region of interest. These criteria may be dependent on the particular application (e.g. metrology) of the beam of radiation. For example, the particular application may have criteria such as a range of acceptable properties for the field at the region of interest. In designing an optical system that fulfils certain criteria for a given application, certain boundary conditions may need to be considered. Boundary conditions may include one or more of: pathlength of a chief ray between an apparent source and the region of interest, pathlength of a chief ray between an intermediate focus region and the region of interest, demagnification of at least one stage of the optical system, focal spot dimensions at the region of interest, divergence of the beam of radiation from the source, numerical aperture of one or more stages of the optical system, grazing angle of incidence of a chief ray incident on one or more reflectors of the optical system, a transmittance through the optical system, reflector dimensions, volume conflicts and volume constraints. Thus, by considering various boundary conditions, it may be possible to design an optical system that fulfils certain criteria, depending on the application.

The first stage may comprise a Kirkpatrick-Baez reflector combination.

The optical system may be configured to focus the beam of radiation on the region of interest of a substrate so that information regarding the region of interest is determinable from radiation that is at least one of: reflected, scattered and diffracted from the region of interest.

At least one of the first stage and second stage may comprise a diffractive element for spatially separating diffracted spectral components of the beam of radiation. The diffractive element may be provided as part of a reflector of at least one of the first stage and the second stage. The diffractive element may be provided as part of the first stage. The diffractive element may be provided as part of a first reflector of the first stage.

The optical system may comprise a spectrometer for determining spectral intensities of the beam of radiation. The spectrometer may comprise the diffractive element. The diffractive element may be provided in a converging portion of the beam of radiation, for example, as part of at least one reflector of the optical system. The diffractive element may be provided on a surface of or as part of at least one reflector. The diffractive element may be configured to specularly reflect a portion the beam of radiation for focusing by the optical system. The diffractive element may be configured to diffract a portion of the beam of radiation.

A pathlength of a chief ray defined between the intermediate focus region and the region of interest may be less than or equal to: 3, 2, 1.5, 1, 0.75, 0.6, 0.5, 0.4 or 0.3 meters At least one of: the first stage and the second stage may comprise an aberration-correcting reflector.

At least one reflector of the Kirkpatrick-Baez reflector combination of the second stage may comprise the aberration-correcting reflector. At least one reflector of the first stage may comprise the aberration-correcting reflector.

The aberration-correcting reflector may be configured such that, in use, rays of the beam of radiation incident on different portions of the aberration-correcting reflector may be focused by at least one of: the first stage and second stage to a substantially aberration-free focal spot.

A surface profile of a reflective surface of the aberration-correcting reflector may have a substantially elliptic-cylindrical shape. The surface profile may have deviations from the elliptic-cylindrical shape. The deviations may be configured to obtain a substantially aberration-free focal spot.

A portion, optionally at least 80%, of the surface profile of the reflective surface may be symmetrical with respect to a symmetry plane. The symmetry plane may be defined where a first intersection between the symmetry plane and the surface profile is a first portion of a first ellipse. Further intersections may be defined between the surface profile and other planes. The other planes may be parallel to the symmetry plane. The other planes may not be intersecting with the symmetry plane. The further intersections may not be exactly equal to any portion of any ellipse. With increasing distances between the other planes at one hand and the symmetry plane at the other hand, the further intersections may increasingly diverge from the first portion of the first ellipse. Symmetrical with respect to the symmetry plane may mean that for the portion of the surface profile there is a corresponding surface profile at the other side of the symmetry plane and that the corresponding surface profile may be a mirrored version of the surface profile at the other side of the symmetry plane. The portion of the surface profile that may be symmetrical with respect to the symmetry plane may be, for example, at least 60%, at least 70%, at least 800/%, at least 90%, at least 95% of the surface profile.

The surface profile may have a straight line where the line is perpendicular to the symmetry plane and may follow the surface profile.

A local Cartesian coordinate system uvw may be defined with an origin at a point where the straight line intersects with the symmetry plane. The w axis may coincide with a normal to the reflective surface at the origin. The v axis may coincide with the straight line. The u axis may be perpendicular to the v and w axis. A w coordinate of the surface profile may be defined by $$w = E_1(u) + c_o v^2 + c_1 u v^2 + c_2 u^2 v^2$$

where $E_1(u)$ defines the first portion of the first ellipse of the first intersection, and $c_o$, $c_1$, $c_2$ are coefficients. At least one of the coefficients $c_o$, $c_1$, $c_2$ may not be equal to 0 and, optionally, at least coefficient c2 may not be equal to 0.

The divergence of the further intersections with the first portion of the first ellipse may correlate more with $c_2 u^2 v^2$ than with $c_o v^2 + c_1 u v^2$.

The aberration-correcting reflector may comprise a substantially cylindrical-shaped reflector surface that deviates from a geometric cylindrical shape having at least one straight focal line defined along an axis of the geometric cylindrical shape such that the substantially cylindrical-shaped reflector surface has at least one curved focal line.

A cross-section of the substantially cylindrical-shaped reflector surface taken along at least one plane that intersects the reflector surface that is parallel to the axis of the geometric cylindrical shape may be curved.

The substantially cylindrical-shaped reflector surface may comprise one of: a substantially elliptic-cylindrical shape; and a substantially parabolic-cylindrical shape.

At least one reflector of the first stage may comprise at least one of: an elliptical-cylindrical reflector; and a parabolic-cylindrical reflector.

The first stage may comprise at least one of: a first reflector and a second reflector.

The first reflector of the optical system may be oriented such that a chief ray of the beam of radiation may have a grazing angle of incidence on the first reflector of greater than or equal to: 1, 2, 3, 4 or 5 degrees.

The second stage may comprise an additional reflector and a further additional reflector. The additional reflector may comprise a second reflector or a third reflector. The further additional reflector may comprise a third reflector or a fourth reflector.

The additional reflector of the optical system may be oriented such that a chief ray of the beam of radiation has a grazing angle of incidence on the additional reflector of greater than or equal to: 5, 6, 7, 8, 9 or 10 degrees.

The reflector of any aspect or embodiment described herein may be configured such that a chief ray of the beam of radiation has a grazing angle of incidence on the reflector that is in the range: 1-20, 1-25 or 1-30 degrees.

At least one of: the first stage and the second stage may be configured to receive the beam of radiation where the beam of radiation has a divergence half-angle of greater than or equal to: 1, 2, 3, 5, 10, 15, 20 or 25 mrad.

A pathlength of a chief ray defined between an apparent source of the beam of radiation and the region of interest may be less than or equal to: 3, 2.5, 2, 1.5, 1.25, 1.1 or 1 meter(s).

The first stage may comprise a first reflector and a second reflector and the second stage may comprise an additional reflector and a further additional reflector, wherein extending from a point (P1) of the optical system, four different rays (AR, BR, aR, bR) of the beam of radiation may be defined such that:

the four different rays (AR, BR, aR, bR) are close to a chief ray of the beam of radiation;
a first plane between the point (P1) and the first reflector may comprise the rays AR and aR and a second plane between the point (P1) and the first reflector may comprise the rays BR and bR, the first plane and the second plane being perpendicular to each other with the chief ray propagating along an intersection line between the first plane and the second plane;

the rays AR and aR may be approximately in a meridional plane of the first reflector and the rays BR and bR may be approximately in a meridional plane of the second reflector such that the ray AR or BR may be the ray with the shortest distance from the point (P1) to the first reflector or second reflector, respectively, and such that the ray aR or bR may be the ray with the longest distance from the point (P1) to the first reflector or second reflector, respectively, wherein an orientation of each of the reflectors may be defined by the ray that travels the shortest distance from the point (P1) to the respective reflector such that, by definition, the first reflector is in an A configuration and the second reflector is in a B configuration, thereby defining the first stage as an AB configuration, and wherein an orientation of the additional reflector and further additional reflector may be configured in one of the following configurations with the shortest distance from the point (P1) to the respective reflector of the second stage:

AB, Ab, aB, ab, BA, Ba, bA, ba.

The respective orientation of the additional reflector and further additional reflector may be defined by the ba configuration.

The first stage may comprise a/the first reflector. The first stage may comprise only the first reflector. The first reflector may comprise an elliptic-cylindrical reflector. The first reflector may comprise any type of elliptic reflector.

The second stage may comprise an additional reflector and a further additional reflector. Extending from a point (P1) of the optical system, four different rays (AR, BR, aR, bR) of the beam of radiation may be defined such that:

the four different rays (AR, BR, aR, bR) are close to a chief ray of the beam of radiation;

a first plane between the point (P1) and the first reflector may comprise the rays AR and aR and a second plane between the point (P1) and the first reflector may comprise the rays BR and bR, the first plane and the second plane may be perpendicular to each other with the chief ray propagating along an intersection line between the first plane and the second plane;

the rays AR and aR may be approximately in a meridional plane of the first reflector such that the ray AR may be the ray with the shortest distance from the point (P1) to the first reflector, and such that the ray aR may be the ray with the longest distance from the point (P1) to the first reflector, wherein an orientation of each of the reflectors may be defined by the ray that travels the shortest distance from the point (P1) to the respective reflector such that, by definition, the first reflector may be in an A configuration, thereby defining the first stage as an A configuration, and wherein an orientation of the additional reflector and further additional reflector may be configured in one of the following configurations with the shortest distance from the point (P1) to the respective reflector of the second stage:

AB, Ab, aB, ab, BA, Ba, bA, ba.

The respective orientation of the additional reflector and further additional reflector may be defined by the AB configuration.

The optical system may be configured to de-magnify the beam of radiation such that there is a different demagnification of the beam of radiation at the region of interest in a meridional plane and a sagittal plane.

A numeral aperture may be defined between the second stage and the region of interest that is greater than or equal to: 0.005, 0.01, 0.05 or 0.1.

At least one reflector may comprise a reflector surface comprising or based on at least one of the following geometric lines or shapes:

a parabola;
a paraboloid;
an ellipse;
an ellipsoid;
a hyperbola;
a hyperboloid;
an elliptical cylinder;
a parabolic cylinder;
a circular cylinder; and
spherical.

According to an aspect or embodiment there is provided a metrology or inspection apparatus. The metrology or inspection apparatus may comprise a substrate table for receiving and holding a substrate at a controllable position. The metrology or inspection apparatus may comprise a radiation source for generating a beam of illumination radiation. The metrology or inspection apparatus may comprise an optical system according to any aspect or embodiment described herein for focusing the beam of illumination radiation at a region of interest on the substrate.

According to an aspect or embodiment there is provided a method of using an optical system for focusing a beam of radiation on a region of interest in a metrology apparatus. The beam of radiation may comprise radiation in a soft X-ray or Extreme Ultraviolet spectral range. The method may comprise providing a first stage for focusing the beam of radiation at an intermediate focus point. The method may comprise providing a second stage for focusing the beam of radiation from the intermediate focus point onto the region of interest. The second stage may comprise a Kirkpatrick-Baez reflector combination. The method may comprise focusing the beam of radiation on the region of interest.

According to an aspect or embodiment there is provided a reflector. The reflector may be configured for correcting aberration in an optical system for focusing a beam of radiation on a region of interest in a metrology apparatus. The beam of radiation may comprise radiation in a soft X-ray or Extreme Ultraviolet spectral range. A surface profile of a reflective surface of the reflector may have a substantially elliptic-cylindrical shape. The surface profile may have deviations from the elliptic-cylindrical shape. The deviations may be configured to obtain an aberration-free focal spot.

A portion, optionally at least 80%, of the surface profile of the reflective surface may be symmetrical with respect to a symmetry plane. The symmetry plane may be defined where a first intersection between the symmetry plane and the surface profile is a first portion of a first ellipse. Further intersections may be defined between the surface profile and other planes. The other planes may be parallel to the symmetry plane. The other planes may not be intersecting with the symmetry plane. The further intersections may not be exactly equal to any portion of any ellipse. With increasing distances between the other planes at one hand and the symmetry plane at the other hand, the further intersections may increasingly diverge from the first portion of the first ellipse.

The surface profile may have a straight line where the line may be perpendicular to the symmetry plane and may follow the surface profile.

A local Cartesian coordinate system uvw may be defined with an origin at a point where the straight line intersects with the symmetry plane. The w axis may coincide with a normal to the reflective surface at the origin. The v axis may coincide with the straight line. The u axis may be perpendicular to the v and w axis. A w coordinate of the surface profile may be defined by $$w = E_1(u) + c_o v^2 + c_1 u v^2 + c_2 u^2 v^2$$

where $E_1(u)$ defines the first portion of the first ellipse of the first intersection, and $c_o$, $c_1$, $c_2$ are coefficients. At least one of the coefficients $c_o$, $c_1$, $c_2$ may not be equal to 0 and, optionally, at least coefficient c2 may not be equal to 0.

The divergence of the further intersections with the first portion of the first ellipse may correlate more with $c_2 u^2 v^2$ than with $c_o v^2 + c_1 u v^2$.

According to an aspect or embodiment there is provided a method of manufacturing a reflector. The reflector may be configured for correcting aberration in an optical system for focusing a beam of radiation on a region of interest in a metrology apparatus. The beam of radiation may comprise radiation in a soft X-ray or Extreme Ultraviolet spectral range. The method may comprise forming a surface profile of a reflective surface of a reflector to have a substantially elliptic-cylindrical shape and such that the surface profile may have deviations from the elliptic-cylindrical shape. The deviations may be configured to obtain an aberration-free focal spot.

According to an aspect or embodiment there is provided a method of correcting aberration in an optical system. The optical system may be configured for focusing a beam of radiation on a region of interest in a metrology apparatus. The beam of radiation may comprise radiation in a soft X-ray or Extreme Ultraviolet spectral range. The method may comprise providing a reflector. A surface profile of a reflective surface of the reflector may have a substantially elliptic-cylindrical shape. The surface profile may have deviations from the elliptic-cylindrical shape. The deviations may be configured to obtain an aberration-free focal spot. The method may comprise correcting for aberration in the optical system using the reflector.

According to an aspect or embodiment there is provided a reflector for correcting aberration in an optical system for focusing a beam of radiation on a region of interest in a metrology apparatus. The beam of radiation may comprise radiation in a soft X-ray or Extreme Ultraviolet spectral range. The reflector may comprise a substantially cylindrical-shaped reflector surface that deviates from a geometric cylindrical shape having at least one straight focal line defined along an axis of the geometric cylindrical shape such that the substantially cylindrical-shaped reflector surface has at least one curved focal line.

In use, the reflector may provide aberration correction in an optical system such that one or more boundary conditions may be relaxed in order to fulfil certain criteria for the optical system. For example, by providing the aberration-correcting reflector, it may be possible to provide certain optical system configurations that would not otherwise fulfil the criteria within the various boundary conditions.

A cross-section of the substantially cylindrical-shaped reflector surface taken along at least one plane that intersects the reflector surface that is parallel to the axis of the geometric cylindrical shape may be curved.

The substantially cylindrical-shaped reflector surface may comprise one of: a substantially elliptical-cylindrical shape; and a substantially parabolic-cylindrical shape.

According to an aspect or embodiment there is provided a method of manufacturing a reflector for correcting aberration in an optical system for focusing a beam of radiation on a region of interest in a metrology apparatus. The beam of radiation may comprise radiation in a soft X-ray or Extreme Ultraviolet spectral range. The method may comprise forming a reflector that comprises a substantially cylindrical-shaped reflector surface that deviates from a geometric cylindrical shape having at least one straight focal line defined along an axis of the geometric cylindrical shape such that the substantially cylindrical-shaped reflector surface may have at least one curved focal line.

According to an aspect or embodiment there is provided a method of correcting aberration in an optical system for focusing a beam of radiation on a region of interest in a metrology apparatus. The beam of radiation may comprise radiation in a soft X-ray or Extreme Ultraviolet spectral range. The method may comprise providing a reflector that comprises a substantially cylindrical-shaped reflector surface that deviates from a geometric cylindrical shape having at least one straight focal line defined along an axis of the geometric cylindrical shape such that the substantially cylindrical-shaped reflector surface may have at least one curved focal line. The method may comprise correcting for aberration in the optical system using the reflector.

According to an aspect or embodiment there is provided an optical system for focusing a beam of radiation on a region of interest. The beam of radiation may comprise radiation in a soft X-ray or Extreme Ultraviolet spectral range. The optical system may comprise a first stage for focusing the beam of radiation at an intermediate focus point. The optical system may comprise a spectrometer for determining spectral intensities of the beam of radiation. The spectrometer may comprise a diffractive element such as a diffraction grating. The spectrometer may comprise a reference detector for determining spectral intensity of the radiation. The spectrometer may be arranged in the first stage. The optical system may comprise a second stage for focusing the beam of radiation from the intermediate focus point onto the region of interest.

The diffractive element may be provided in a converging portion of the beam of radiation.

At least one of the first stage and the second stage may comprise a reflector.

The first stage may comprise at least one of:
an ellipsoidal reflector,
two paraboloidal reflectors in a (finite-infinite)-(infinite-finite) configuration,
a KirkPatrick-Baez reflector combination wherein two elliptically-cylindrical reflectors are positioned orthogonally with respect to each other,
a Wolter reflector combination with an ellipsoidal reflective surface and a hyperboloidal reflective surface.

The second stage may comprise at least one of:
a further ellipsoidal reflector.
two further paraboloidal reflectors in a (finite-infinite)-(infinite-finite) configuration,
a further KirkPatrick-Baez reflector combination wherein two elliptically-cylindrical reflectors are positioned orthogonally with respect to each other,
a further Wolter reflector combination with an ellipsoidal reflective surface and a hyperboloidal reflective surface.

Combinations of the first stage and the second stage may comprise at least one of the subsequent combinations:
- the first stage comprising the ellipsoidal reflector and the second stage comprising the further Wolter reflector combination,
- the first stage comprising the two paraboloidal reflectors and the second stage comprising the further Wolter reflector combination,
- the first stage comprising the KirkPatrick-Baez reflector combination and the second stage comprising the further KirkPatrick-Baez reflector combination, and
- the first stage comprising the KirkPatrick-Baez reflector combination and the second stage comprising the further Wolter reflector combination.

At least one of the reflectors may be arranged to receive the beam of radiation at an angle of incidence whereby the angle between a center of the beam of radiation and a surface of the reflector may be smaller than 30 degrees, or optionally, smaller than 20 degrees, or optionally, smaller than 10 degrees.

The diffraction grating may be provided on the reflector or one of the reflectors.

The reflector or at least one of the reflectors may comprise a coating comprising ruthenium or any other appropriate coating.

At least one of the first stage and the second stage may be a demagnification stage.

According to an aspect or embodiment there is provided a further optical system for focusing a beam of radiation on a region of interest. The beam of radiation may comprise radiation in a soft X-ray or Extreme Ultraviolet spectral range. The optical system may comprise a first reflector, a second reflector, a third reflector, and a spectrometer for determining spectral intensities of the beam of radiation. The order of the reflectors may be, in the transmission direction of the beam of radiation, the first reflector, the second reflector and the third reflector.

The beam of radiation may originate from a source point or an apparent source.

The first reflector may reimage the source point or apparent source to a first virtual image.

The second reflector may reimage the first virtual image to a second virtual image.

The third reflector may reimage the second virtual image to a location on the region of interest.

At least one of: the first reflector may have a convex hyperboloidal shape, the second reflector may have a concave ellipsoidal shape, and the third reflector may have a concave hyperboloidal shape.

At least one of the first reflector, the second reflector and the third reflector may comprise a KirkPatrick-Baez reflector combination wherein two elliptically-cylindrical reflectors are positioned orthogonally with respect to each other.

The spectrometer may comprise a diffractive element such as a diffraction grating being provided in a converging portion of the beam of radiation.

The illumination sub-system of a metrology apparatus that uses radiation generated by HHG may provide a relatively large demagnification factor. Furthermore, in order to focus the radiation, the illumination sub-system preferably has similar characteristics for the different wavelengths in the radiation. Additionally, the illumination sub-system may need to be relatively efficient which means that it may have a relatively high transmission factor for the different wavelengths of the radiation. Also, the metrology apparatus may have certain volume limitations and the illumination sub-system may preferably be relatively compact and at least fit within a predefined volume while avoiding volume conflicts between different components. In the metrology apparatus there may also be a need to incorporate a reference measurement branch that comprises a spectrometer that measures the intensities of the different wavelengths in the radiation generated by the HHG principle. The reference measurement branch may preferably be incorporated in the illumination sub-system.

Aspects or embodiments of the optical system and the metrology or inspection apparatus are provided in the claims and in the detailed description.

At least one feature of any aspect or embodiment described herein may replace any corresponding feature of any aspect or embodiment described herein. At least one feature of any aspect or embodiment described herein may be combined with any other aspect or embodiment described herein.

BRIEF DESCRIPTION OF THE DRAWINGS

Embodiments of the invention will now be described, by way of example only, with reference to the accompanying schematic drawings, in which:

FIG. 11 depicts a schematic perspective representation of a substantially cylindrical-shaped reflector surface;

FIGS. 12(a)-12(b) depict contour plots representative of an aberration-correcting reflector.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable reflector array and a programmable LCD array.

Figure 1:
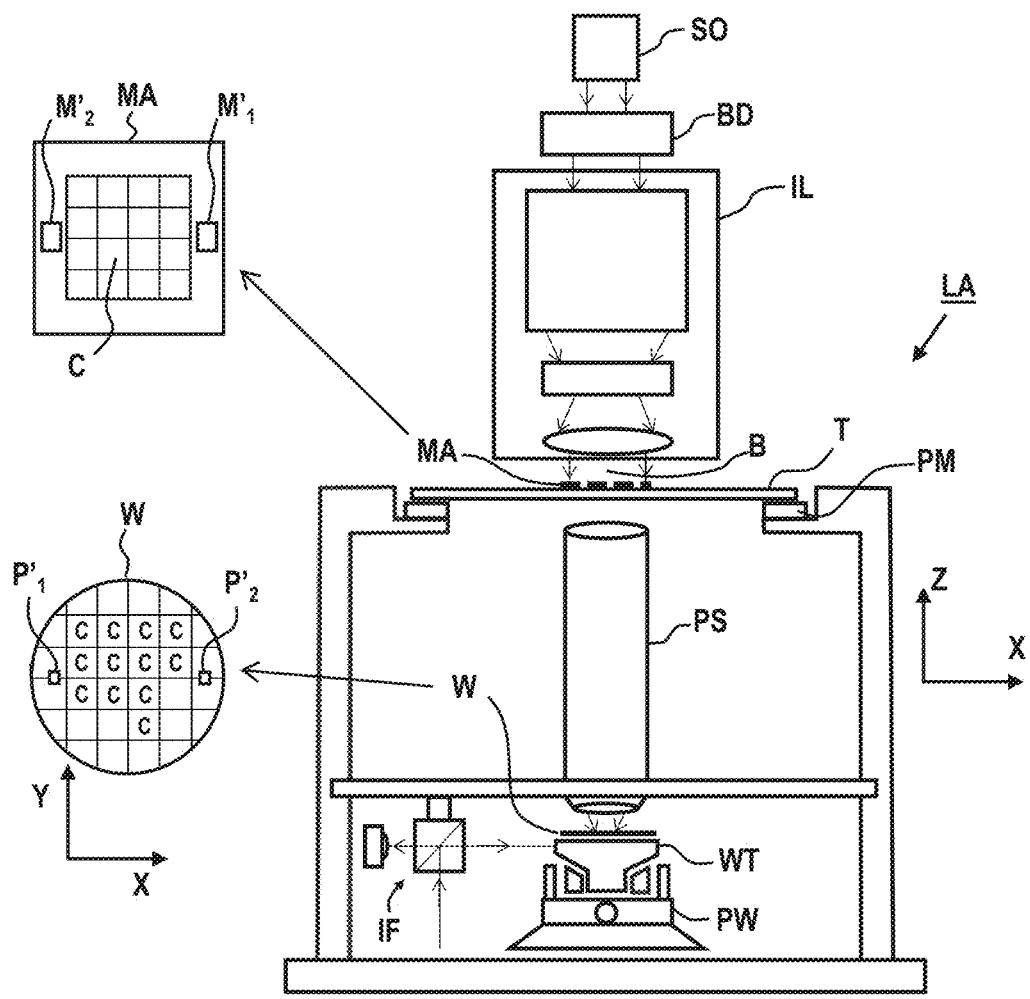
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M'1, M'2 and substrate alignment marks P'1, P'2. Although the substrate alignment marks P'1, P'2 as illustrated occupy dedicated target portions, they may be located in spaces between target portions. Substrate alignment marks P'1, P'2 are known as scribe-lane alignment marks when these are located between the target portions C.

Figure 2:
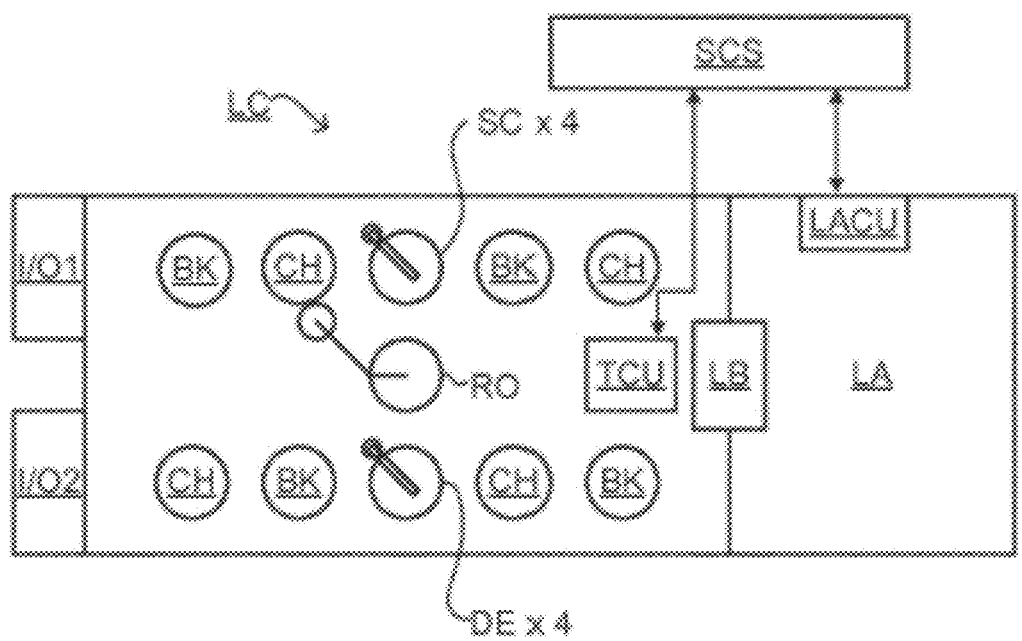
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line-widths, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus or metrology tool MT, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
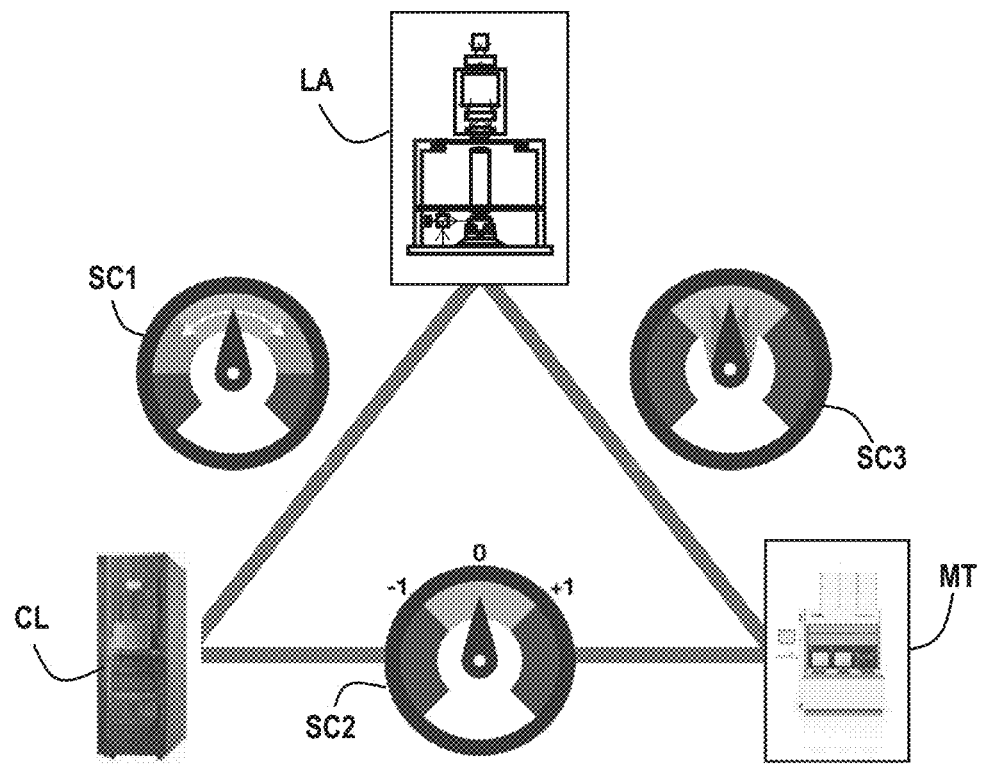
FIG. 3 depicts a schematic representation of holistic lithography, representing cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary. The metrology tool MT may provide information that can be used for multiple purposes. The information provided by the metrology tool MT depends on the stage at which metrology measurements are performed in the manufacturing process. It is possible to create a feedback loop between the metrology tool MT and other tools used in the manufacturing process, for example, as part of the lithography, etch or chemical-mechanical polishing (CMP) steps. Information provided by aspects or embodiments of the present invention may be used by the metrology tool MT, as part of the feedback loop or by any other tools used in the manufacturing process.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer, reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/

012624 or US patent application US 20160161863, incorporated herein by reference in its entirety.

Other parameters of interest may be focus and dose. Focus and dose may be determined simultaneously by scatterometry (or alternatively by scanning electron microscopy) as described in US patent application US2011-0249244, incorporated herein by reference in its entirety. A single structure may be used which has a unique combination of critical dimension and sidewall angle measurements for each point in a focus energy matrix (FEM—also referred to as Focus Exposure Matrix). If these unique combinations of critical dimension and sidewall angle are available, the focus and dose values may be uniquely determined from these measurements.

A metrology target may be an ensemble of composite gratings, formed by a lithographic process, mostly in resist, but also after etch process for example. These gratings diffract radiation that is captured by measurement optics. The design of the measurement optics may be such that the wavelength used by the scatterometer and the NA of the optics can capture diffraction orders from the metrology targets so that parameters such as pitch and line-width of the gratings can be determined. As indicated earlier, the diffracted signal may be used to determine shifts between two layers (also referred to 'overlay') or may be used to reconstruct at least part of the original grating as produced by the lithographic process. This reconstruction may be used to provide guidance of the quality of the lithographic process and may be used to control at least part of the lithographic process. Targets may have smaller sub-segmentation which are configured to mimic dimensions of the functional part of the design layout in a target. Due to this sub-segmentation, the targets will behave more similar to the functional part of the design layout such that the overall process parameter measurements resembles the functional part of the design layout better. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and not yet published U.S. patent application Ser. No. 15/181,126, incorporated herein by reference in its entirety.

As an alternative to optical metrology methods, it has also been considered to use soft X-rays or EUV radiation, for example radiation in a wavelength range between 0.1 nm and 100 nm, or optionally between 1 nm and 50 nm or optionally between 10 nm and 20 nm. One example of metrology tool functioning in one of the above presented wavelength ranges is transmissive small angle X-ray scattering (T-SAXS as in US 2007224518A which contents are incorporated herein by reference in their entirety). Profile (CD) measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques can be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the soft X-rays or EUV domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling and x-ray mathematical model and an optical mathematical model through one or more common.

Figure 4:
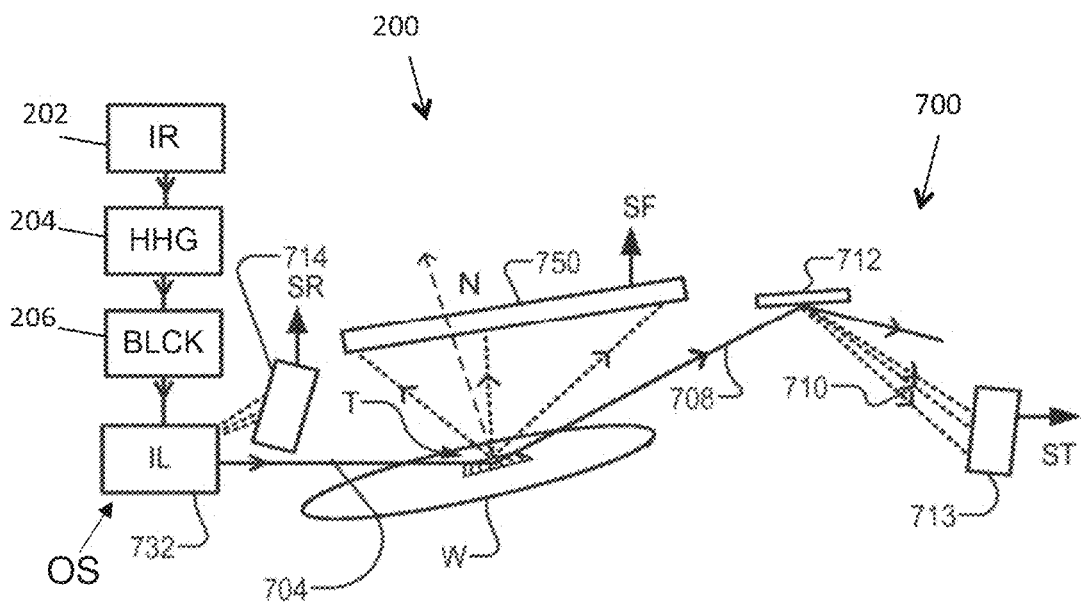
FIG. 4 depicts a schematic representation of a metrology apparatus that uses radiation in the soft X-ray or EUV spectral range.

FIG. 4 shows a metrology apparatus 200 that may use soft X-ray or EUV radiation to determine characteristics of a substrate, for example, characteristics of a target T on a wafer W. The metrology apparatus 200 comprises an Infrared (IR) laser 202, a HHG mechanism 204, an optional IR blocking element 206, an illumination sub-system 732 that may comprise a reference detector 714, a higher order detector 750, and a spectrometer 700. The illumination sub-system 732 comprises an optical system OS, examples of which are described in further detail herein.

The IR laser 202 seeds the Higher Harmonic Generation (HHG) mechanism 204. The IR laser 202 generates short drive pulses of IR radiation that are focused within the HHG mechanism 204 in a HHG medium. The HHG medium may be a gas. The HHG medium converts a portion of the IR radiation towards soft X-ray and/or EUV radiation having according to the Higher Harmonic Generation principle. Compact sources of SXR radiation include HHG sources, in which infrared pump radiation from a laser is converted to shorter wavelength radiation by interaction with a gaseous medium. HHG sources are available for example from KMLabs, Boulder Colo., USA (http://www.kmlabs.com/).

The generated soft X-ray and/or EUV radiation enters the illumination sub-system 732. Before entering the illumination sub-system, the optional IR blocking element 206 may block a substantial portion of the IR drive beam. The illumination sub-system 732 may comprise a reference measurement branch that comprises the reference detector 714 that generates a reference measurement signal SR. The reference detector 714 may be part of a spectrometer that measures the intensities of the difference wavelengths in the generated soft X-ray and/or EUV radiation.

The metrology apparatus 200 may comprise a sub-system to receive and hold a substrate at a specific position, such as, for example the wafer W. In an embodiment, the sub-system is a wafer table. The wafer W may comprise a target T of which one or more characteristics may be determined. The illumination sub-system 732 is arranged to direct, in use, illumination radiation 704 onto the target T on the wafer W and the illumination sub-system 732 may be arranged to focus the illumination radiation 704 onto the target T.

The target T, or any other structure on the wafer W, may scatter or diffract the illumination radiation 704. The reflected radiation 708 (i.e. the specularly reflected radiation) is received by spectrometer 700. The spectrometer may comprise grating 712 which reflected radiation 708 into a reflection spectrum 710 of different wavelengths. The reflection spectrum 710 is captured by detector 713 which generates a reflection measurement signal ST. Higher-diffraction-order radiation from the target T impinges on the higher-order detector 750 which generates a higher-order measurement signal SF.

Some or all of the apparatus 200 may be evacuated, and the evacuated region may include the wafer W.

The metrology apparatus 200 may comprise a processor (not shown) and/or controller that receives the reference measurement signal SR, the higher order measurement signal SF and/or the reflection measurement signal ST. The processor and/or controller may be arranged to process these signals to determine a measurement value of the property of interest of the target T. Optionally, the processor and/or controller may also control the generation of soft X-ray and/or EUV radiation by controlling the IR laser 202 and/or the HHG mechanisms 204. The processor and/or controller may also control a sub-system that receives and holds the wafer W.

Hereinafter an optical system and a further optical system are discussed that are suitable to focusing a beam of radiation on a region of interest comprising the target T. The discussed optical systems may be used in the illumination sub-system 732 of the metrology apparatus 200. Please note that it may also be used in an inspection apparatus that comprises a source of illumination radiation and a substrate table to receive and hold a substrate.

Potential requirements on the optical system OS or a further optical system OS can be summarized in five items: the optical system OS may focus radiation in the soft X-ray or EUV spectral range, the optical system OS may focus radiation that has a broadband character (or, at least comprises multiple wavelength peak in a relatively broad spectrum), the optical system OS may have relatively large demagnification with a diffraction limited focus, the optical system OS may fit within a relatively small volume such that the metrology apparatus has a relatively small footprint, and the optical system OS may use a reference grating of a reference measurement branch. As described further herein, the demagnification of an optical system may be defined by a ratio between an apparent source dimension and a corresponding beam spot dimension at the region of interest, wherein the optical system images the apparent source onto the region of interest to form the beam spot.

In an embodiment, one or more reflectors are used for manipulating the beam of radiation B generated by a source. The radiation may impinge at grazing angles of incidence on the reflectors. The reflectors may comprise a coating that may comprise ruthenium or any other appropriate coating. It will be understood that the term "reflector" may comprise or refer to a reflector. In some embodiments, at least one reflector may comprise a reflective element, which may function as a reflector. In some embodiments, at least one reflector may comprise a diffractive element, which may function to at least one of: reflect, diffract and scatter radiation. Thus, the diffractive element may also function as a reflector and diffract radiation. Where the term "reflector" is used herein, this may be understood as referring to the general term "reflector".

The optical system and the further optical system may function to provide an imaging system for imaging an apparent point source onto a region of interest. The beam of radiation may be generated in a different plane to the apparent point source. It will be appreciated that in reality the apparent point source has a finite size.

Examples of a point to point imaging system consists of one single (demagnification) stage, for which a number of solutions exist. In such a single stage, there is no intermediate focus and hence there are only two field planes: the object plane and the image plane, which correspond to the source and the region of interest on the substrate, respectively. It is possible to design a single stage solution that fulfils certain criteria. Such criteria may include, for example, an acceptable positioning accuracy for the focus of the beam of radiation and acceptable field behavior of the beam of radiation. Various boundary conditions may limit the ability to fulfil the criteria such as an acceptable demagnification of an apparent point source, manufacturability of the optical components of the optical system and limited volume availability within which to accommodate the optical system OS. While it may well be possible to design a single stage solution that optimizes one or more parameters of the optical system that may fulfil certain criteria, it may not necessarily be possible to completely fulfil the criteria within the particular boundary conditions. Further, the available volume for accommodating the optical system OS may depend on various factors such as proximity of other components of the optical system OS or other components of the metrology tool MT. More details of a multiple reflector single stage solution are discussed later in the context of the further optical system.

Therefore, in an example, a two stage solution is discussed hereinafter that may overcome one or more problems associated with single stage solutions. In a two stage solution there may be an intermediate focus point (IFP) between the two stages. It will however be appreciated that while an IFP may be preferred, in some embodiments there may not be an IFP or there may be an astigmatic IFP due to aberrations in the optical system. The term "intermediate focus region" may be used to refer to an IFP or an astigmatic IFP. A circle of least confusion may be defined at the intermediate focus region. The circle of least confusion may encircle all rays of the beam of radiation passing through the intermediate focus region.

Figure 5:
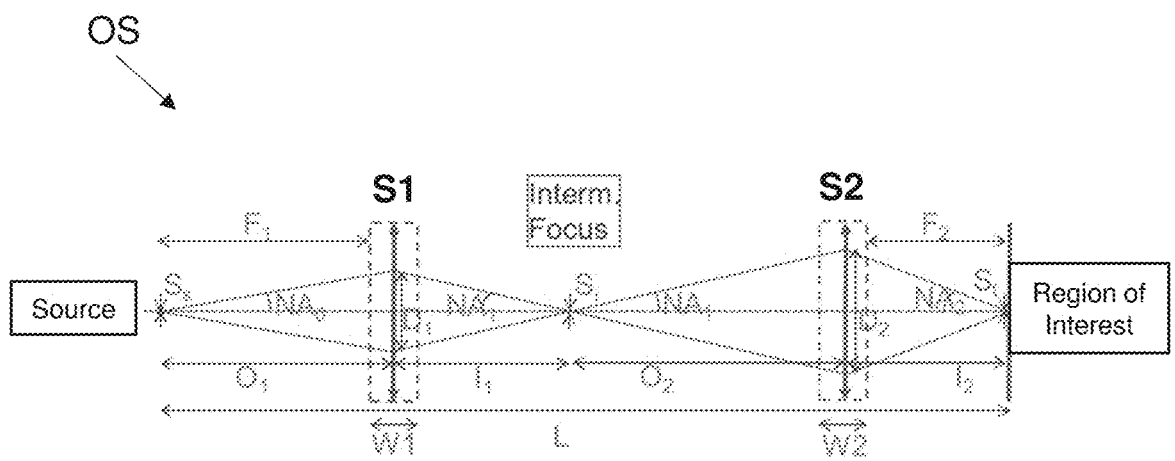
FIG. 5 depicts a schematic representation of a two-stage optical system.

A parametrization of the basic geometry of a two-stage illumination system (e.g. optical system OS) is shown in FIG. 5, which depicts a geometric parametrization of the optical system OS (which may be suitable for use in the illumination sub-system 732 of the metrology apparatus 200). Ss, Si and St are the apparent source, intermediate focus and focal spot diameters at the region of interest, respectively; S1 and S2 the demagnification stages of the two reflector systems, respectively; F1 and F2 the free working distances on object and image side, respectively; W1 and W2 the lengths of the reflector (-combinations); D1 and D2 the beam footprints on the reflectors; and L the total pathlength. It will be appreciated that if the apparent source, intermediate focus and focal spot has a circular cross-section, the diameter of that cross-section in any direction is the same. However, if any of the apparent source, intermediate focus and focal spot does not have a circular cross-section, then the diameter of that cross-section may not the same in different directions. For example, an elliptical apparent source, intermediate focus or focal spot has a different diameter along its major and minor axes. Therefore, where reference is made to a diameter or other dimension of the apparent source, intermediate focus or focal spot, it will be appreciated that this diameter or other dimension may refer to any diameter or other dimension of the apparent source, intermediate focus or focal spot. For example and where appropriate, if a range is defined where a lower limit is defined, then the range may apply to the smallest diameter or dimension of the apparent source, intermediate focus or focal spot. On the other hand and where appropriate, if a range is defined where an upper limit is defined, then the range may apply to the largest diameter or dimension of the apparent source, intermediate focus or focal spot To avoid a drawing of a radiation path that is hard to interpret, this figure shows the equivalent lens system, as if the light is in transmission of the optical elements. In reality, the optical elements may be (curved) reflectors from which the light reflects with very small grazing angles of incidence (e.g. in the range 1-20 degrees or any other appropriate range). For the understanding of the system this makes no difference. In addition to the parameters in the figure, other relevant parameters are: total transmittance T, total demagnification M, angles of incidence on the reflectors $\beta i$ (for reflector i), the number of reflectors N (the demagnification stages may have multiple reflectors), the coating material of the reflectors.

Also note that: i) The reflectors denoted by a first stage (S1) and a second stage (S2) in the optical system may also be reflector combinations (combinations of single reflector elements) that together can perform point to point imaging. The first stage (S1) and second stage (S2) may have first and second demagnifications, respectively. Examples of such reflector combinations include: a Kirkpatrick-Baez (KB) reflector combination, a Wolter reflector combination or a combination of two off-axis paraboloid reflectors; ii) a reference grating is optionally placed within the illumination branch, preferably in a converging beam or is provided as part of a reflector, as described in further detail herein. Due to volume conflicts close to the wafer, a reference grating may be preferably placed in the discussed embodiments after the reflector (-combination) of the first demagnification stage.

In an example of the optical system, L is within 1 to 2 meters, T (transmittance requirement) is larger than 0.3, the free working distance F2 is larger than 5 centimeters, and the spot diameter at the region of interest is smaller than 2 micrometers.

Based on knowledge of certain sources of soft X-ray and/or EUV radiation, the total demagnification M defined by the product of the demagnifications of S1 and S2 may be at least 10.

The above presented stages S1 and S2 may be chosen from the set of: 1. a single ellipsoidal reflector; 2. Two paraboloidal reflectors in a (finite-infinite)-(infinite-finite) configuration; 3. A Kirkpatrick-Baez reflector combination in which two elliptic-cylindrical reflectors are positioned orthogonally with respect to each other, such that each reflector is focusing only in one direction. As a result, the demagnification of this reflector combination is different in the two orthogonal directions. 4. A Wolter reflector combination, which has two reflective surfaces: an ellipsoidal and hyperboloidal surface. 5. A single elliptical reflector, for example, an elliptic-cylindrical reflector.

Figure 6:
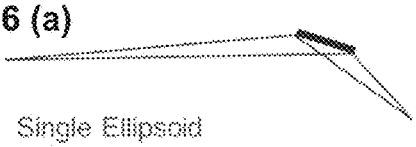
FIG. 6(a)-6(e) depict schematic representations of various reflectors or reflector combinations for use in an optical system.
Figure 6:
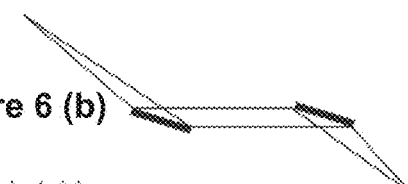
Figure 6:
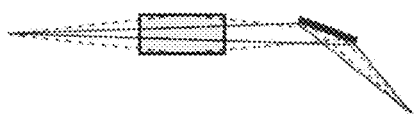
Figure 6:
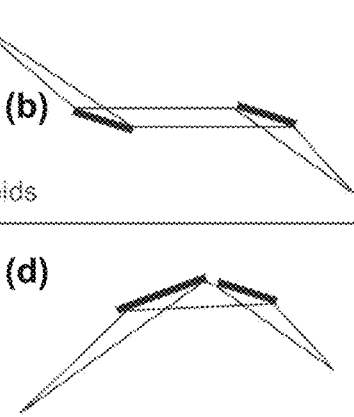
Figure 6:

The different basic reflector combinations are schematically depicted in FIG. 6, which shows four basic building blocks or reflector combinations that can be used for finite-finite conjugate imaging with demagnification. Reflector (a) is a single ellipsoid reflector. Reflector combination (b) comprises two paraboloid reflectors. Reflector combination (c) comprises a Kirkpatrick-Baez (KB) reflector combination. Reflector combination (d) comprises a Wolter reflector combination. Reflector (e) is a single elliptic-cylindrical reflector.

The reflector combinations (b) to (d) may have a number of implementation forms, orientation permutations and hybrid forms:

The reflector elements within the combination can have different rotational permutations, the axis of rotation being the chief ray of the light between the two reflector elements.

The Kirkpatrick-Baez reflectors could be nested (this is known as a Montel reflector): instead of positioning the orthogonal reflectors after each other, they may be manufactured, integrated or glued together as one element. Some rays may hit first the vertical and then the horizontal reflective surface, other rays the other way around.

The Kirkpatrick-Baez reflector elements have a priori no curvature in the tangential plane of the reflectors (they are cylindrical). However, variations exist in which the surface is spherical (part of a sphere with a single radius), toroidal (part of a torus with two different radii of curvature in the two orthogonal directions), or elliptical in one direction (the direction with demagnifying power) and with a single radius of curvature in the other direction (the orthogonal direction, also called the tangential plane)

Depending on whether the reflections are on the inner or other surface, the Wolter reflector comes in three different types.

One or both of the stages S1 and S2 may comprise multiple reflectors that form together a point-to-point imaging system.

The inventors have found that certain reflector combinations in the stages S1 and S2 are more optimal given the different requirements than other reflector combinations.

An optional example of a stage S1 and S2 combination is the single ellipsoidal reflector (S1) that is followed by the Wolter reflector combination (S2).

An optional example of a stage S1 and S2 combination is the two paraboloidal reflectors (S1) that is followed by a Wolter reflector combination (S2).

An optional example of a stage S1 and S2 combination is the Kirkpatrick-Baez reflector combination (S1) that is followed by another Kirkpatrick-Baez reflector combination (S2).

An optional example of a stage S1 and S2 combination is the Kirkpatrick-Baez reflector combination (S1) that is followed by a Wolter reflector combination (S2).

The inventors have also found that a reference grating can be put on or provided as part of at least one of the reflectors. This may avoid volume conflicts between optical components since no separate reference grating may be required in order for spectral intensity analysis of the radiation. In particular, if the Kirkpatrick-Baez reflector combination is used as a first stage, it may be possible to provide the reference grating on one of the reflectors of the Kirkpatrick-Baez reflector combination. It will of course be appreciated that the reference grating may be provided as part of a reflector or reflector surface. Thus, a 0th-order specular reflection from the reference grating may direct a majority portion of the radiation to a subsequent part of the optical system. A ±1st-order or higher diffraction order provided by the reference grating may be analyzed on a detector analogous to a spectrometer. The reference grating is an example of a diffractive element for use as part of a spectrometer for determining spectral intensities of the beam of radiation (i.e. the illumination radiation 704 depicted by FIG. 4).

Graphically, the four above presented stage S1-S2 combinations are presented in FIGS. 7*a*-*d*. FIG. 7 depicts different optical systems OS providing possible combinations of a point to point imaging system by using reflectors. KB=Kirkpatrick-Baez reflector combination, Wolter refers to the Wolter reflector combination, Ellipsoid to a single ellipsoidal reflector and Paraboloid—Paraboloid to a combination of Two paraboloidal reflectors in a (finite-infinite)-(infinite-finite) configuration.

Figure 7:
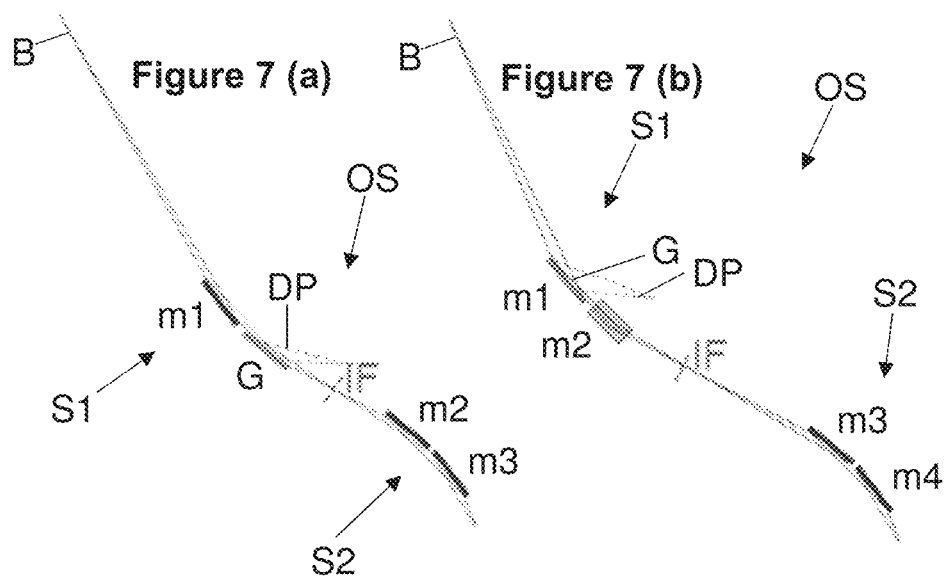
FIG. 7(a)-7(d) depict schematic representations of various two-stage optical system combinations.

In FIG. 7(*a*), the depicted optical system OS comprises a first stage S1 comprising an ellipsoid reflector m1. The first stage S1 is followed by a second stage S2 comprising a Wolter reflector combination that comprises a second reflector m2 and a third reflector m3. The optical system OS further comprises a separate reference grating G provided between the ellipsoid reflector m1 and the intermediate focus IF. The reference grating G is provided in a converging portion of the beam of radiation B. In this example, the reference grating G comprises a variable line spacing (VLS) grating. In this embodiment, the second reflector m2 is an example of an additional reflector and the third reflector m3 is an example of a further additional reflector.

In FIG. 7(*b*), the depicted optical system OS comprises a first stage S1 comprising a KB reflector combination comprising first and second reflectors m1 and m2. The first stage S1 is followed by a second stage S2 comprising a Wolter reflector combination comprising third and fourth reflectors m3 and m4. The optical system OS further comprises a reference grating G provided as part of reflector m of the first stage S1, which as noted above may save space to reduce the volume and/or footprint of the optical system OS. In this embodiment, the third reflector m3 is an example of an additional reflector and the fourth reflector m4 is an example of a further additional reflector.

In FIG. 7(*c*), the depicted optical system OS comprises a first stage S1 comprising a paraboloid reflector combination comprising first and second reflectors m1 and m2. The first stage S1 is followed by a second stage S2 comprising a Wolter reflector combination comprising third and fourth reflectors m3 and m4. The optical system OS further comprises a separate reference grating G provided between the reflectors m1 and m2. In this example, the reference grating G comprises a flat grating. In this embodiment, the third reflector m3 is an example of an additional reflector and the fourth reflector m4 is an example of a further additional reflector.

In FIG. 7(*d*), the depicted optical system OS comprises a first stage S1 comprising a KB reflector combination comprising first and second reflectors m1 and m2. The first stage S1 is followed by a second stage S2 comprising a further KB reflector combination comprising third and fourth reflectors m3 and m4. Similar to the example of FIG. 7(*b*), a reference grating G is provided as part of the first reflector m1. In a preferred arrangement, the reference grating G is provided in the first stage S1. In a further preferred arrangement, the reference grating is provided on the first reflector m1 of the first stage S1. In this embodiment, the third reflector m3 is an example of an additional reflector and the fourth reflector m4 is an example of a further additional reflector.

In each of FIGS. 7(*a*)-(*d*) the reference grating G is depicted as both reflecting radiation (i.e. the 0th order) to a subsequent point in the optical system OS. In addition, a higher order portion of the beam of radiation B is diffracted towards a spectrometer (not shown). In the case of FIG. 7(*c*), the higher order diffracted portion of the beam of radiation is manipulated using a folding reflector m5. In each of FIGS. 7(*a*)-(*d*), the reference grating G is configured to diffract a portion of the beam of radiation B such that a diffracted radiation beam portion DP can be directed to a reference detector (not shown), as described herein. Further features and details of the reference grating G provided in FIGS. 7(*a*)-(*d*) are described herein with reference to the embodiment depicted by FIG. 13.

Figure 8:
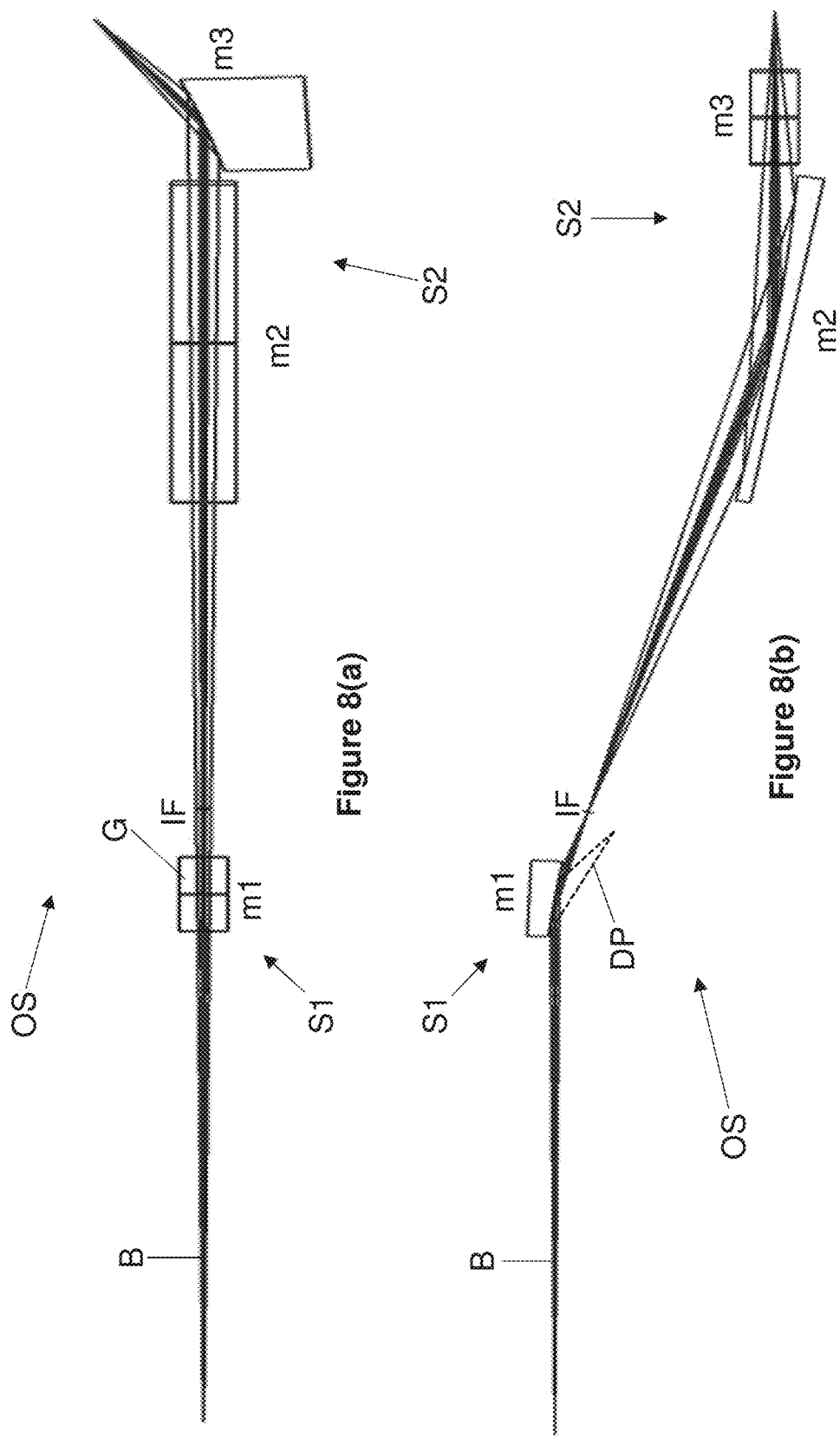
FIGS. 8(a)-8(b) respectively depict top and side schematic representations of another two-stage optical system combination.

A further example of an optical system OS comprising a first and second stage S1 and S2 combination is depicted by FIGS. 8(*a*)-(*b*), which respectively show top and side representations of the optical system OS. In contrast to the optical system OS of FIG. 7(*d*), the optical system OS of FIG. 8 only comprises a first reflector m1 in the form of a single elliptic-cylindrical reflector m1 for its first stage S1. However, like the optical system OS of FIG. 7(*d*), the optical system OS of FIG. 8 comprises a Kirkpatrick-Baez reflector combination comprising second and third reflectors m2 and m3 for its second stage S2. Due to only having a single elliptic-cylindrical reflector m1 for its first stage, the beam of radiation B does not focus to a point-like stigmatic intermediate focus point IFP between the first and second stages S1 and S2. Rather, the first reflector m1 focuses the beam of radiation B to an elliptical focal line in the intermediate focus IF region between the first and second reflectors m1 and m2. The first reflector m1 comprises a reference grating G configured such that a diffracted radiation beam portion DP can be directed to a reference detector (not shown). In this embodiment, the second reflector m2 is an example of an additional reflector and the third reflector m3 is an example of a further additional reflector.

Since there are fewer reflectors in the embodiment of FIG. 8 compared with the embodiment of FIG. 7(*d*), there may be less overall scattering so that the transmittance through the optical system OS may be increased. The cost of the optical system OS may be reduced due to there being fewer components compared with the embodiment of FIG. 7(*d*). In this embodiment, the first and second reflectors m1 and m2 are configured such that the beam of radiation B has an equal grazing angle of incidence (GAOI) on each reflector m1 and m2. In addition, the second and third reflectors m2 and m3 are configured relative to the wafer (not shown) such that the beam of radiation B has a GAOI on the third reflector m3 that is equal to half the GAOI on the wafer. This particular configuration of the reflectors m1, m2 and m3 and the wafer W may allow the optical system OS to be neatly structured in space, which may simplify the optomechanical frame (not shown) and the mounting of the optical components. Different configurations of the reflectors m1, m2 and m3 and the wafer may still allow the optical system OS to be accommodated as required. As will be described in greater detail herein, one or more of the reflectors may provide an aberration-correcting functionality. In the present embodiment, the third reflector m3 provides this aberration-correcting functionality.

The inventors have put substantial effort into identifying examples of advantageous optical systems OS that fulfil certain criteria based on certain boundary conditions. These criteria and boundary conditions are described in more detail below.

There may be certain criteria to fulfil in terms of the properties of the beam of radiation B focused on the region of interest RoI. These criteria may be dependent on the particular application of the beam of radiation B. An example application of the beam of radiation B is described in relation to the embodiment depicted by FIG. 4 where the metrology apparatus 200 is used to determine characteristics of the substrate W. There may be multiple different implementations of the metrology apparatus 200. Thus, the criteria to fulfil in terms of the properties of the beam of radiation B focused on the region of interest RoI may vary depending on the application.

Various boundary conditions are described herein. One or more of these boundary conditions may be used to define examples of advantageous optical systems OS.

An example of a boundary condition is the pathlength of a chief ray defined between an intermediate focus region and a region of interest RoI, as depicted by the embodiment of FIG. 5 and described in relation to other embodiments. As defined below, optical systems OS described herein may be configured with a relatively short pathlength between an intermediate focus region and a region of interest RoI compared with other examples of optical systems. A relatively short pathlength between the intermediate focus region and the region of interest RoI may allow a relatively compact optical system OS to be provided. In such optical systems OS, the pathlength of a chief ray may be defined between the intermediate focus region and the region of interest RoI that is less than or equal to: 3, 2, 1.5, 1, 0.75, 0.6, 0.5, 0.4 or 0.3 meter(s).

A further example of a boundary condition is the pathlength of a chief ray defined between an apparent source and a region of interest RoI, as depicted by the embodiment of FIG. 5 and described in relation to other embodiments. As defined below, optical systems OS described herein may be configured with a relatively short pathlength between an apparent source and a region of interest RoI compared with other examples of optical systems. A relatively short pathlength between the apparent source and the region of interest RoI may allow a relatively compact optical system OS to be provided. In such optical systems OS, the pathlength of a chief ray may be defined between the apparent source of the beam of radiation B and the region of interest RoI that is less than or equal to: 3, 2.5, 2, 1.5, 1.25, 1.1 or 1 meter(s).

A further example of a boundary condition is the demagnification of the beam of radiation B by the optical system, wherein the optical system images an apparent source onto a region of interest to form a beam spot. The demagnification may, for example, be defined by the ratio between an apparent source dimension such as the 86.5% encircling source radius and a corresponding beam spot dimension at the region of interest RoI such as the 86.5% encircling beam spot radius. The 86.5% encircling source radius may be in the range 1 to 15 micrometers. The demagnification of the optical system OS may be greater than or equal to: 1, 2, 5, 10, 15, 20 or 25.

A further example of a boundary condition is the beam spot dimension at the region of interest RoI. The beam spot dimension at the region of interest RoI may be defined by 86.5% encircling beam spot radius being equal to or less than at least one of: 5, 4, 3, 2, 1.5, 1.25, 1, 0.75, 0.66 and 0.5 microns. It will be appreciated that the beam spot dimension may not be equal in all directions (e.g. if the beam spot is non-circular) and thus, the beam spot radii defined above may refer to the largest of the different radii of the beam spot.

It will be appreciated that the demagnification may be the same or different in different directions depending on the dimensions of the apparent source of the beam of radiation B and the criteria for the beam spot dimensions at the region of interest RoI. For example, using a local Cartesian coordinate system XYZ for a beam of radiation B between two optical components where the beam path between the two optical components is in the Z direction, a cross-section of the beam of radiation B in the XY plane may be defined such that the same or a different demagnification may be defined in the X and Y directions. It will also be appreciated that the demagnification may depend on the pathlength of the chief ray defined between the apparent source and the region of interest RoI. Thus, if a certain demagnification range is used to fulfil the criteria, this demagnification range may affect or be affected by other boundary conditions such as the available range of pathlengths for the optical system OS, or the like.

A further example of a boundary condition is the numeral aperture (NA) of the optical system with respect to a beam of radiation focused on the region of interest RoI. This numerical aperture may be greater than or equal to at least One of: 0.005, 0.01, 0.05 and 0.1. It will be appreciated that if a certain numerical aperture range is used to fulfil the criteria, this numerical aperture range may affect or be affected by other boundary conditions such as available range of pathlengths for the optical system OS, or the like.

A further example of a boundary condition is the grazing angle of incidence (GAOI) that can be accepted by reflectors of the optical system OS. In an example, a first reflector of the optical system may be oriented such that a chief ray of the beam of radiation has a GAOI on the first reflector of greater than or equal to at least one of: 1, 2, 3, 4 and 5 degrees. In a further example, a third or additional reflector of the optical system may be oriented such that a chief ray of the beam of radiation has a GAOI on the third or additional reflector of greater than or equal to at least one of: 5, 6, 7, 8 and 10 degrees. It will be appreciated that any reflector of any optical system OS described herein may be oriented such that a chief ray of the beam of radiation has a GAOI on that reflector of greater than or equal to at least one of: 1, 2, 3, 4, 5, 6, 7, 8, 9 and 10 degrees. In a further example, the GAOI may be in the range 1-20 degrees. It will also be appreciated that if a certain GAOI range is used to fulfil the criteria, this GAOI range may affect or be affected by other boundary conditions such as transmittance of the optical system OS, volume conflicts, or the like.

A further example of a boundary condition is the divergence of the apparent source of the beam of radiation B. At least one stage of the optical system OS may be configured to receive the beam of radiation B where the beam of radiation B has a divergence half-angle of greater than or equal to at least one of: 1, 2, 3, 5, 10, 15, 20 and 25 mrad. For a Gaussian beam, the divergence half-angle of the beam of radiation B may be defined by the expression $\theta \approx \lambda 0/(\pi n w 0)$ where $\lambda 0$ is the wavelength, n is the refractive index and $w0$ is the beam waist radius. It will be appreciated that the divergence is related to the numerical aperture or acceptance numerical aperture of the optical system OS. The numerical aperture may be about 2× the expected (Gaussian) beam divergence half-angle $\theta$. In more general terms, divergence or convergence may be defined as half the apex angle of a beam cone at the $1/e2$ intensity level. It will be appreciated that there may be different divergence half-angles in the X and Y directions. Although the divergence half-angle or numerical aperture values for the X and Y directions may be different, they may still be of a similar order of magnitude. It will also be appreciated that if a certain divergence half-angle or numerical aperture range is used to fulfil the criteria, this divergence half-angle or numerical aperture range may affect or be affected by other boundary conditions such as transmittance of the optical system OS, volume conflicts, or the like.

Throughout this disclosure and where appropriate, the term "divergence" may refer to the divergence half-angle defined above. However, where appropriate, the term "numerical aperture" may be more appropriate if referring to the properties of the optical system itself. The numerical aperture NA may be calculated using the maximum half-angle that may propagate through the optical system OS. Since the divergence half-angle is defined at the 86.5%, or equivalently the $1/e2$, intensity level, the maximum half-angle is larger than the divergence half-angle. Typically, it may be assumed that the maximum half-angle that may propagate through the system is slightly more than about 2 times larger than the divergence half-angle. However it will be appreciated that the ratio between the maximum half-angle and the divergence half angle may be different, for example, less than or more than 2.

A further example of a boundary condition is the transmittance of the optical system. The transmittance of the optical system OS may be greater than or equal to at least one of: 0.1, 0.2, 0.3 and 0.4. It will be appreciated that if a certain transmittance range is used to fulfil the criteria, this transmittance range may affect or be affected by other boundary conditions such as available range of beam divergence for the optical system OS, or the like.

A further example of a boundary condition is to ensure that there are no volume conflicts between components of the optical system OS, the beam of radiation and/or any other components.

A further example of a boundary condition is the reflector dimensions. The reflector dimensions may be such that substantially the whole beam of radiation B is reflected (e.g. greater than or equal to at least one of: 80%, 90%, 95%, 99% of the energy of the beam is reflected) providing there are no volume conflicts between the reflectors and other reflectors or other components.

In some cases, adjusting one boundary condition may affect another boundary condition which may or may not result in the beam of radiation B not fulfilling the criteria for the optical system OS. For example, aberrations may become unacceptably large for the given criteria if the numerical aperture accepted by the optical system OS is too large. While a single reflector in one or more stages may be beneficial in terms of reducing the number of components in the optical system OS and hence increasing transmittance, such a reflector may not achieve a sufficiently aberration-free performance if the acceptance numerical aperture is too large. It will thus be appreciated that there are multiple boundary conditions which can be varied in order to provide an optical system OS that fulfils the criteria.

As described in further detail below, the inventors have identified a number of optical systems OS that fulfil the criteria for given boundary conditions. In one example, an optical system OS that fulfils the criteria comprises two-stages where each stage comprises a Kirkpatrick-Baez (KB) reflector combination as shown by FIG. 7(d). In another example, an optical system OS that fulfils the criteria comprises two-stages where only the second stage comprises a Kirkpatrick-Baez (KB) reflector combination as shown by FIG. 8. The use of KB reflector combinations may provide benefits due to each reflector being curved in one direction only as opposed to some reflectors comprising doubly-curved reflective surfaces such as ellipsoidal surfaces (which may be more costly or difficult to manufacture within certain design constraints). Such benefits may include: reduced scattering, ease of manufacturability and control over the demagnification provided in both the X and Y directions. If the beam of radiation B has a large divergence half-angle between the apparent source and the optical system OS, then aberrations may become more relevant to the extent that the focal spot of the beam of radiation at the RoI may not fulfil the criteria for use in a metrology tool or other applications. It is possible to optimize the reflector surface shape of at least one of the reflectors in the optical system OS to provide an aberration-correcting reflector that is configured to compensate for the effect of such aberrations. Such shape optimization of the particular type of reflector used in the KB reflector combination has not been identified prior to this disclosure. By providing at least one aberration-correcting reflector, it may be possible to use a beam of relatively large beam divergence (or large numerical aperture acceptance) while also ensuring that the beam quality is maintained to provide a focal spot at the RoI that fulfils the criteria. Thus, the provision of at least one aberration-correcting reflector may represent a further example of a boundary condition that may provide more freedom to vary other boundary conditions such as the acceptance numerical aperture of the optical system OS, the pathlength of the chief ray between the apparent source and the region of interest RoI or the like.

Figure 9:
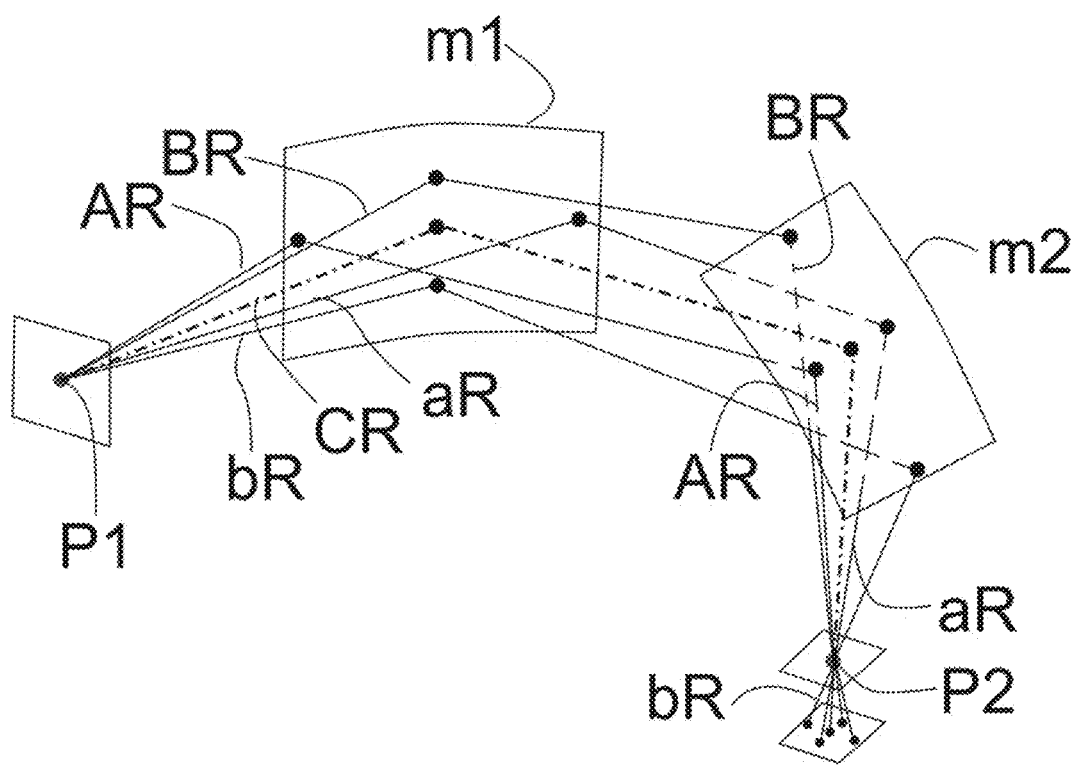
FIG. 9 depicts a schematic perspective representation of a stage of an optical system.

FIG. 9 schematically depicts a reference system for defining reflector orientations in any stage of any optical system OS described herein that comprises at least one KB reflector combination such as depicted by FIGS. 7(d) and 8. There are multiple ways to orient the respective reflectors of the first and second stages. FIG. 9 defines a reference system for determining the possible orientations. The following description of the reference system is particularly applicable to the embodiment of FIG. 7(d) but could be applied to other embodiments as well.

Firstly, a meridional plane can be defined. For a given chief ray and reflector surface, the meridional plane is defined as the plane of incidence of the chief ray.

Secondly, sagittal planes can be defined. For an incident chief ray and reflector surface, the corresponding sagittal plane is defined as the plane orthogonal to the meridional plane and containing the incident chief ray. For a reflected chief ray and reflector surface, the corresponding sagittal plane is defined as the plane orthogonal to the meridional plane and containing the reflected chief ray.

Thirdly, the orientation of the reflectors can be defined in relation to points P1 and P2 of the optical system OS, where:

Point P1 may correspond to an apparent source (in which case FIG. 9 depicts a first stage S1 of the optical system OS) or an intermediate focus region (in which case FIG. 9 depicts a second stage S2 of the optical system OS).

Point P2 may correspond to an intermediate focus region (in which case FIG. 9 depicts a first stage S1 of the optical system OS) or a focal spot at the region of interest (in which case FIG. 9 depicts a second stage S2 of the optical system OS).

The optical system OS comprises two stages S, S2, where each stage corresponds to the stage depicted by FIG. 9 but where the particular orientation of the reflectors may be defined as described herein.

CR as the chief ray.

AR, BR, aR and bR as four different rays close to the chief ray CR. As depicted by FIG. 9, the beam between a point source P1 and a first reflector m1 is divergent. The purpose of the ray description provided herein is to define the different possible orientation relationships between the reflectors.

The rays AR, BR, aR, and bR are defined such that a plane comprising the rays AR-aR and a further plane comprising the rays BR-bR are at a perpendicular angle with respect to each other, with the chief ray CR at the intersection point between the planes. In other similar words, a first plane between the point P1 and the first reflector comprises the rays AR and aR and a second plane between the point P1 and the first reflector comprises the rays BR and bR, the first plane and the second plane being perpendicular to each other with the chief ray propagating along an intersection line between the first plane and the second plane.

Furthermore, the configuration of the rays AR, BR, aR and bR are defined as follows:

AR and aR are approximately in the meridional plane of the first reflector (m1)

BR and bR are approximately in the meridional plane of the second reflector (m2)

This is such that the ray AR or BR is the ray with the shortest distance from the point P1 to the first reflector or second reflector, respectively, and such that the ray aR or bR is the ray with the longest distance from the point P1 to the first reflector m1 or second reflector m2, respectively.

The capital ray (AR or BR) is the ray with the shortest distance and the minor ray (aR or bR) is the ray with the longest distance from point P1 to reflectors m1 or m2, respectively Therefore:

The orientation of a reflector is defined by the ray that travels the shortest distance from the point P1 to the respective reflector. Therefore, by definition m1 is in an "A" orientation or configuration and m2 is in the "B" orientation or configuration. Thus, the combination of m1 and m2 can be defined as an 'AB' configuration, as depicted by FIG. 9.

A double-Kirkpatrick-Baez system can thus be configured as e.g. 'ABBA', or 'ABab', or 'ABBa' etc. Since the first two reflectors are by definition in the 'AB' configuration, there are 8 (4×2) possible configurations.

Thus, an orientation of a third (or additional) reflector (m3) and fourth (or further additional) reflector (m4) in a second stage that uses the same reference system is configured in one of the following configurations with the shortest distance from the point P1 to the respective reflector of the second stage: AB, Ab, aB, ab, BA, Ba, bA, ba. It will be appreciated that where FIG. 9 depicts first and second reflectors m1, m2, in the context of a second stage S2, these reflectors m1, m2 may respectively refer to additional and further additional reflectors (for example, third and fourth reflectors m3, m4 in a four-reflector optical system or second and third reflectors m2, m3 in a three-reflector optical system).

In one example, it has been demonstrated that a desired imaging performance may be achieved if the respective orientation of the third (or additional) reflector (m3) and fourth (or further additional) reflector (m4) is defined by the "ba" configuration. In other words, the optical system OS is provided in the "ABba" configuration. This was found to be the most favorable configuration to achieve high demagnification in short pathlength and to relax position tolerances. However, configurations such as "ABBA" and others may also provide a desired imaging performance.

The reference system described above is also applicable to the embodiment of FIG. 8. Therefore, a revised description of that reference system is now provided since the embodiment of FIG. 8 comprises three reflectors.

The same definition of the four different rays (AR, BR, aR, bR) described above is applicable to the embodiment of FIG. 8. Again, an orientation of each of the reflectors is defined by the ray that travels the shortest distance from the point (P1) to the respective reflector such that, by definition, the first reflector m1 is in an A configuration, thereby defining the first stage as an "A" configuration. The orientation of the second (or additional) reflector m2 and third (or further additional) reflector m3 is configured in one of the following configurations with the shortest distance from the point (P1) to the respective reflector of the second stage: AB, Ab, aB, ab, BA, Ba, bA, ba. In the particular configuration depicted by FIG. 8, the respective orientation of the second (or additional) reflector m2 and third (or further additional) reflector m3 is defined by the AB configuration.

The following description provides some further details regarding the configuration of the optical system OS according to the embodiment of FIG. 7(d). The details provided below may also be applicable to the embodiment of FIG. 8 or any other embodiment described herein.

The configuration of the optical system OS is the "ABba" configuration described above.

In one example, the surface normal of the target (i.e. the RoI) may be under an angle of 30±2 degrees with the respect to the chief ray incident on the target. In another example, this angle may be 6±2 degrees. The angle may be chosen to accommodate the detection of the radiation that at least one of: scatters, diffracts and reflects from the target. The above examples of angles may be optimal values for certain configurations of the metrology apparatus MT. It will however be appreciated that the angle selected may depend on the particular type or configuration of the metrology apparatus MT and therefore the angle used may be different to those indicated in the above examples. For example, the angle between the chief ray incident on the target and the surface normal may be any angle between 4 and 32 degrees, or indeed any other appropriate angle above or below this range.

The direction of the target rotation with respect to the chief ray is chosen such that the meridional plane of the fourth reflector (m4) is incident with the sagittal plane of the target, the sagittal plane comprising the incident chief ray. This relaxes the tightest position tolerances of the reflectors m1 to m4.

There is a different demagnification in the meridional plane and sagittal plane of the target. This is due to the oblique angle of incidence on the target (30 degrees with the surface normal). The demagnification difference is (close to)

$$\frac{M_{mer}}{M_{sag}} = \cos\theta,$$

where Mmer refers to the demagnification in the meridional plane and Msag refers to the demagnification in the sagittal plane. As a result, the beam spot shape at the RoI/target is made such that its projection on the target is optimized to form a desired beam spot shape, which may be circular, elliptical or any other appropriate shape depending on the criteria. This may at least one of: maximize the utilization of the target area, minimize the divergence of the beam of radiation on the target and relax the optical design by allowing a smaller demagnification in the sagittal direction. Minimizing the divergence on the target may result in a less complex data processing step for analyzing the information in the radiation reflected, scattered and/or diffracted from the target.

The reference grating G may be provided as part of the first reflector m1 or second reflector m2. Providing the reference grating as part of either of the third or fourth reflectors m3 or m4 (or the additional or further additional reflectors) may, in some examples, create a volume conflict for the reference detector if no additional folding reflectors/reflectors can be provided. Providing the grating G on the first reflector m may have several advantages. For example, the grating may be further away from intermediate focus, there may be less curvature of the reflector m1. However, in another example, the reference grating G may be provided as part of the second reflector m2.

In an example, the reference grating G comprises a variable line space (VLS) diffractive element, meaning that the line density of the grating varies in the direction perpendicular to the lines according to a certain function (e.g. a polynome, or the like). One purpose of the VLS is to minimize aberrations of the dispersed light on the reference detector.

In one example, the aberration correction may be provided as part of the third (or additional) reflector m2, m3 or fourth (or further additional) reflector m3, m4. The exact choice of which reflector m2, m3, m4 provides the aberration correction may not be very strict and may be led simply by the cost of manufacture in some examples. It will however be appreciated that any of the first, second, third or fourth reflectors m1, m2, m3, m4 may comprise the aberration-correcting reflector. In some examples, the first and second reflectors m1 and m2 may not be suitable for comprising the aberration-correcting reflector (although it will be appreciated that the aberration correction may still be provided on at least one of the first and second reflectors m1, m2 in other examples). In order to aid alignment of the reflectors, the intermediate focus IF may ideally be kept stigmatic. In some examples, most aberrations are thought to be a result of the third and fourth reflectors m3 and m4 due to the larger NA associated with these reflectors (as compared to the first and second reflectors m1 and m2). Precompensating of aberrations due to m3 and m4 on either m1 or m2 may lead to a lower quality intermediate focus IF, rendering alignment more difficult. In one example, the third reflector m3 was selected to comprise an aberration-correcting reflector over the fourth reflector m4 because the larger size of the third reflector m3 may allow for a smaller freeform correction with the same result compared to a correction on the fourth reflector m4. Moreover, in one example, the curvature of the fourth reflector m4 may be larger than the curvature of the third reflector m3. In such an example, it may be easier to manufacture the third reflector m3 with a freeform correction so as to provide an aberration-correcting function. It will however be appreciated that the optical system OS may be modified so that one or more of any of the reflectors may comprise an aberration-correcting reflector.

Grazing angles of incidence (GAOI) on the reflectors may not, in some examples, be larger than about 18 degrees because of loss of reflectivity associated with larger angles. Smaller GAOI may lead to less scattering and lower curvatures of the reflectors, which may ease reflector manufacturing constraints.

GAOI on the reflectors may not, in some examples, be larger than about 3 degrees for the first and second reflectors m1, m2 and more than about 8 degrees for the third and fourth reflectors m3, m4 to prevent volume conflicts. Smaller GAOI may result in reflectors being too large relative to the volume constraint. The GAOI may be determined by the beam footprint (i.e. NA and distance to focus) and available space. Larger GAOI may lead to lower aberrations (and hence less strict alignment tolerances).

In summary the optical system OS may be configured for focusing a beam of radiation B on a region of interest (i.e. a target such as on a substrate W) in a metrology apparatus. That beam of radiation comprises radiation in a soft X-ray or Extreme Ultraviolet spectral range although the optical system OS may be applicable to other spectral ranges. In some examples, the optical system comprises a first stage for focusing the beam of radiation at an intermediate focus region. The optical system further comprises a second stage for focusing the beam of radiation from the intermediate focus region onto the region of interest. In a preferred embodiment, the second stage comprises a Kirkpatrick-Baez (KB) reflector combination as described above. In the preferred embodiment, the first stage also comprises a KB reflector combination. However, in some embodiments, the first stage may not necessarily comprise a standard KB reflector combination. For example, the first reflector and/or second reflector m1, m2 may comprise a parabolic-cylindrical reflector instead of an elliptical-cylindrical reflector. A parabolic-cylindrical reflector may be suitable for focusing a collimated beam of radiation (e.g. where the apparent radiation source is effectively at infinity). Where the apparent source is at a finite position, the KB pair combination comprising the elliptical-cylindrical reflector combination may be preferred. It will however be appreciated that the specific configuration can vary depending on the particular system parameters and constraints.

As described below, the optical system OS may have a relatively large NA resulting in a relatively small spot size at the RoI. There may be a relatively short pathlength between the apparent source and the RoI (e.g. for finite-finite conjugate imaging) with a relatively large demagnification. The radiation may be relatively broadband (e.g. in the spectral range 10-20 nm or the like), which may reduce the usability for zone plates in any of the optics. The optical system may be configured to de-magnify the beam of radiation such that there is a different demagnification of the beam of radiation at the region of interest in a meridional plane and a sagittal plane.

A numeral aperture defined between the second stage and the region of interest may be greater than or equal to 0.005, and optionally greater than at least one of: 0.01, 0.05, and 0.1.

Next, the provision of an aberration-correcting reflector is discussed with reference to FIG. 10.

Figure 10:
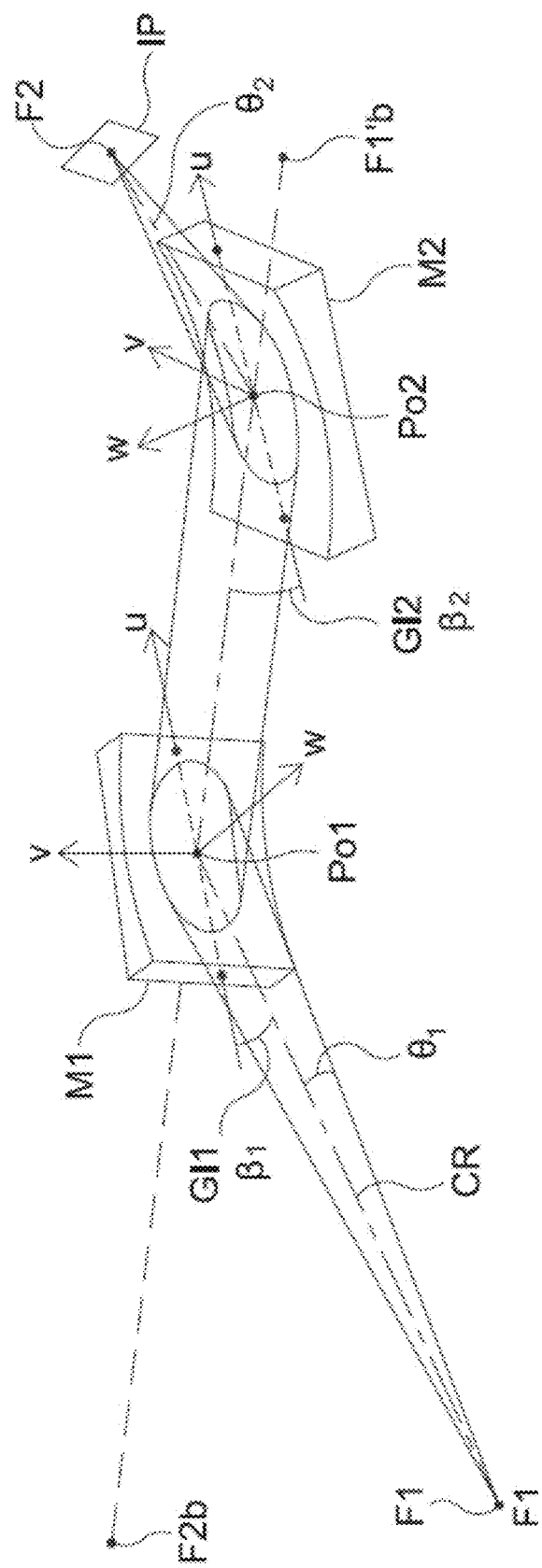
FIG. 10 depicts a schematic perspective representation of an optical system for correcting aberrations.

FIG. 10 schematically depicts a KB reflector pair comprising reflectors M1 and M2. For the avoidance of any doubt, reflectors M1 and M2 can refer to any KB reflector combination described herein such as first and second reflectors m1 and m2 or third (or additional) and fourth (or further additional) reflectors m2, m3 and/or m4. As will be appreciated from the above description, in a preferred embodiment, the third (or additional) reflector m3 comprises an aberration-correcting reflector. However, it will be appreciated that one or more of the reflectors in any of the stages may comprise an aberration-correcting reflector.

In FIG. 10, a focal point F1 is imaged onto a second focal point F2; the latter being in an image plane IP. It is possible to define local Cartesian coordinate systems uvw on the reflectors M1 and M2. The origins of the coordinate systems are at the intersection points P1 and P2 between the chief ray and the respective reflector surface, with w perpendicular to the reflector surface, u parallel to the reflector surface in the plane of incidence (meridional plane), and v parallel to the reflector surface in the sagittal plane. The grazing angles of incidence are denoted as GI1 and GI2 with respective angles $\beta 1$ and $\beta 2$.

In a KB reflector combination designed to handle beams with large divergences θ1 and θ2, the general shape of the reflectors M1 and M2 is that of elliptical cylinders, with M1 having focal lines passing through points F1 and F1b and reflector M2 having focal lines passing through points F2 and F2b. The distance Po1-F1'b is equal to the distance Po1-Po2-F2; and analogously for reflector M2. For smaller beam divergences, circular-cylindrical or even spherical surfaces may be used instead of elliptical-cylindrical reflector surfaces.

The aberration-correcting reflector may be configured such that, in use, rays of the beam of radiation incident on different portions of the aberration-correcting reflector are focused by at least one of: the first stage and second stage to a substantially aberration-free focal spot (e.g. at the RoI). As described above, the third (or additional) reflector of the second stage may preferably comprise an aberration-correcting reflector.

Using the local coordinate system uvw defined above, it is possible to define a freeform correction function for a surface profile of an aberration-correcting reflector. This function is applicable to an elliptical-cylindrical surface but it will be appreciated that other functions could be used in a similar way to define other types of reflector surface.

Let the functions $E1(u)$ and $E2(u)$ describe the w coordinate (also known as: 'sag') for such elliptical surfaces for reflectors M1 and M2, respectively. In particular, for larger beam divergences (θ1 and/or θ2), rays emitted from focal point F1 may not all pass through focal point F2. Thus, the KB reflector pair has an optical aberration. This aberration can be addressed by a sag correction C(u,v) applied to at least one of the two reflector surfaces M1 and M2. For example, if the sag correction is applied to reflector M1, its surface can be described by the equation $w=E1(u)+C(u,v)$. The sag correction can generally be approximated well as:

$$C(u,v)=c_0v^2+c_1uv^2+c_2u^2v^2,$$

where the optimal values for the coefficients c0, c1, c2 are dependent on the chosen KB configuration (distances F1-Po1, Po1-F1'b, F2b-Po2, Po2-F2; angles β1 and β2). Typically, the largest contribution is that of the c2 term.

In the above example, the reflector surface profiles are elliptical cylinders, which are developable surfaces. A basic KB design could also use a doubly-curved reflector surfaces (e.g. wal, or the like), in which the two principal curvatures are of the same order of magnitude. In a grazing-incidence geometry e.g. β<0.4 rad), most of the ray deflection (relative to the chief ray) may occur in the plane of incidence.

As will be understood from the above description, at least one reflector of a KB reflector combination comprises an aberration-correcting reflector. In this embodiment, a reflector surface RS of the aberration-correcting reflector comprises a substantially elliptical-cylindrical shape although it will be appreciated that other cylindrical-shaped reflector surfaces RS such as a substantially parabolic-cylindrical shape may be provided.

FIG. 11 schematically depicts a perspective view of a cylindrical-shaped reflective surface RS that is intended to schematically represent the reflective surface RS of an aberration-correcting reflector 100. The degree of curvature of the reflective surface RS is exaggerated for ease of understanding. The local coordinate system uvw depicted by FIG. 10 is also depicted in FIG. 11.

A surface profile of a reflective surface RS of the aberration-correcting reflector 100 has a substantially elliptic-cylindrical shape. Although not obviously apparent from FIG. 11, the surface profile has deviations from the elliptic-cylindrical shape. The deviations are configured to obtain a substantially aberration-free focal spot when focusing a beam of radiation B through the optical system OS, which may otherwise produce a focal spot that suffers from aberrations (i.e., without the aberration-correcting reflector 100). Thus, where at least one of the surface profiles of the reflectors of the optical system OS does not deviate from an elliptic-cylindrical shape, there is an increased chance that the beam of radiation B will suffer from aberrations at the focal spot of the optical system OS. Providing at least one aberration-correcting reflector 100 in the optical system may therefore help to obtain the substantially aberration-free focal spot.

A portion, which in this case is at least 80%, of the surface profile is symmetrical with respect to a symmetry plane 102 defined where a first intersection between the symmetry plane 102 and the surface profile is a first portion 104 of a first ellipse. Further intersections are defined between the surface profile and other planes (not shown but will be apparent from the following description). The other planes are parallel to the symmetry plane 102 and do not intersect with the symmetry plane 102. Thus, the further intersections are not exactly equal to any portion of any ellipse. With increasing distances between the other planes at one hand and the symmetry plane 102 at the other hand, the further intersections increasingly diverge from the first portion of the first ellipse. The surface profile also has a straight line 106 where the line 106 is perpendicular to the symmetry plane 102 and follows the surface profile. The at least 80% portion of the surface profile is symmetrical with respect to the symmetry plane 102—symmetrical with respect to the symmetry plane 102 means that for at least 80% of the surface profile there is a corresponding surface profile at the other side of the symmetry plane 102 and that the corresponding surface profile is a mirrored version of the surface profile at the other side of the symmetry plane 102. The remaining less than 20% portion of the surface profile may or may not be symmetrical with respect to the symmetry plane 102. In an embodiment, the symmetry plane 102 is not exactly in the middle of the reflector and then there is always a portion of the reflector that does not have a corresponding portion at the other side of the symmetry plane. It may also be that for a relatively small portion of the surface profile a corresponding portion at the other side of the symmetry plane 102 is not an exactly mirrored surface profile.

The local Cartesian coordinate system uvw is defined with an origin 108 at the point where the straight line 106 intersects with the symmetry plane 102. The w axis coincides with a normal to the reflective surface RS at the origin 108. The v axis coincides with (i.e., is parallel to) the straight line 106. The u axis is perpendicular to the v and w axis. Using this system, a w coordinate of the surface profile is defined by $$w=E_1(u)+c_0v^2+c_1uv^2+c_2u^2v^2$$

where $E_1(u)$ defines the first portion 104 of the first ellipse of the first intersection, and $c_o$, $c_1$, $c_2$ are coefficients described above. In one embodiment, at least one of the coefficients $c_o$, $c_1$, $c_2$ is not equal to 0. In another embodiment, at least coefficient c2 is not equal to 0. In another embodiment, the divergence of the further intersections with the first portion 104 of the first ellipse correlates more with $c_2u^2v^2$ than with $c_ov^2+c_1uv^2$. In other words, for the latter embodiment, the contribution due to the term containing the second coefficient c2 is greater than the collective contribution from the terms containing the zeroth and first coefficients c0 and c1.

Due to measuring errors and/or polishing errors, a measurement of the actual reflective surface RS may differ from the ideal (i.e., aberration-correcting) reflective surface RS described by the formula for the w-coordinate of the reflective surface RS of the aberration-correcting reflector 100. For example, if the contribution of one or more of the polynomial terms results in a certain w-coordinate of the aberration-correcting reflective surface RS having a 1 micrometer deviation from the corresponding w-coordinate of a geometric elliptic-cylindrical shape, the error between the measurement and the ideal reflective surface RS described by the formula may be, for example, 100 nm (e.g. 10% of the deviation). The error may be greater or lower than 10%. The acceptable error may represent a boundary condition that affects whether or not the criteria in terms of optical system OS performance are fulfilled.

An example of an aberration-correcting reflector 100 is depicted by the contour plots indicative of the reflective surface RS profile in FIGS. 12(a)-(b). FIG. 12(a) depicts a substantially elliptic-cylindrical reflective surface RS defined by the function W(u,v) that define the shape of the aberration-correcting reflector 100. Note that the contours vary between a height range of between 0 and just above 4 mm. The axes of the plot are also in mm and represent the dimensions of the sides of the reflector 100.

Although FIG. 12(a) depicts an aberration-correcting reflector 100, the aberration-correction is not immediately apparent from FIG. 12(a) alone because only small changes in height have been made to the reflective surface RS to provide the aberration correction. FIG. 12(b) depicts the residual sag profile H(u, v)=W(u, v)−W(0, v)−W(u, 0) that corresponds to the aberration-correction applied to the aberration-correcting reflector 100, where W(0, v) and W(u, 0) are elliptical-represent cylindrical functions with respect to the u and v coordinates that represent the positions along the reflective surface RS and W represents the height at the respective coordinate. Note that the contours vary between a height range of between 0 and just above 8 μm and thus the aberration-correction is not immediately apparent from FIG. 12(a) which describes a height range several orders of magnitude higher than the aberration correction. The residual sag profile H(u, v) can be described by the expression $C(u, v)=c_0v^2+c_1uv^2+c_2u^2v^2$ described above. In this case, the residual sag profile is described by the coefficients (approximately) c0=−9×10−6 [m−1], c1=9×10−5 [m−2], and c2=0.8 [m−3]. The contributions of the three coefficients to the sag correction are on the order of 10 nm, 10 nm, and 10 μm, respectively.

An example of a method to obtain the sag correction is now described. First, an optical design is made based on uncorrected surfaces, such as the E1 and E2 surfaces described above. With standard optical raytracing software such as Zemax or CodeV®, a number of rays (for example, 1000 rays) from an apparent point source located at focal point F1 is traced through the optical system. These rays will at some point intersect with the image plane IP; ideally, all rays pass through a single point. If not, the mismatch could be quantified by the root-mean-square deviation of the rays as they intersect with the image plane IP. One of the reflectors in the beam path, for example M'1 in FIG. 1, is chosen to carry the aberration corrections. Initially, the coefficients c0, c1, c2 are set to zero; these values are then varied to minimize the mismatch (RMS error).

If the shape correction is too large, it is possible to run into limitations of the manufacturing process. If this is the case, one could distribute the correction over two reflectors: set the correction to the maximum possible value at one reflector, then apply the same optimization procedure to a second reflector.

It will be appreciated that there are many potential methods to obtain the correction; for example, it may be possible to select a different coordinate systems to the one described above and apply the correction more generally to an arbitrary-shaped reflector surface profile.

Figure 13:
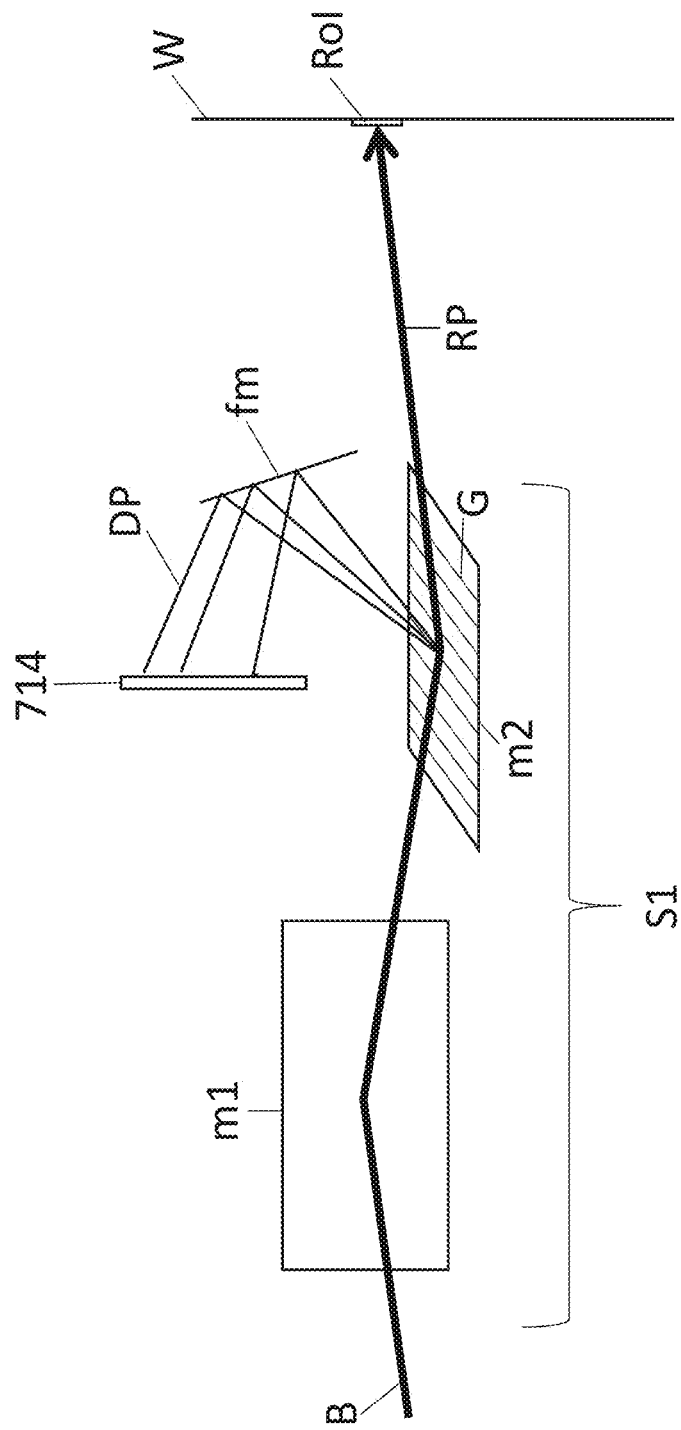
FIG. 13 depicts a schematic representation of a further example optical system.

FIG. 13 depicts a further embodiment of an optical system OS. The optical system OS comprises a single stage S for focusing the beam of radiation B onto a region of interest RoI of a substrate W. The optical system OS comprises a first reflector m1 and a second reflector m2. The optical system OS is configured as a KB reflector combination for de-magnifying the beam of radiation in the X and Y directions as described above.

The optical system OS further comprises a reference grating G, which in this embodiment is provided as part of the second reflector m2. The reference grating G may comprise a diffractive element such as a variable line spacing (VLS) grating or any other appropriate diffractive element. The reference grating G specularly reflects a portion RP of the beam of radiation B so that the specularly reflected radiation portion RP is focused on the region of interest RoI while another radiation portion DP of the beam of radiation B is diffracted by the reference grating G. The diffracted radiation portion DP is collected by a folding reflector fm provided in the beam path of the diffracted radiation portion DP. The folding reflector fm directs the diffracted radiation portion DP to a reference detector 714. The reference detector 714 may comprise a sensor configured to measure the intensity of different spectral parts of the diffracted radiation portion DP, or the like. Thus, the reference grating G and the reference detector 714 may provide the functionality of a spectrometer. The reference grating G may allow the beam of radiation B to be sampled (e.g. for diagnostic purposes, or the like) while also allowing the reflected radiation portion RP to be focused on the region of interest RoI at the same time.

Providing the reference grating G as part of one of the reflectors m1, m2 may allow spectral monitoring to be performed while minimizing the number of components in the optical system OS. For example, FIGS. 7(a) and 7(c) depict embodiments where a separate reference grating G is provided. In contrast, FIGS. 7(b), 7(d) and 8 depict embodiments where the reference grating G is provided as part of the first reflector m1 of the first stage S1 (thus avoiding the reference grating G being provided as a separate component). In the cases of FIGS. 7(b), 7(d) and 8, there is a reduced possibility of a volume conflict between a reference detector 714, the beam of radiation B and a substrate W since the reference grating G is provided as part of the first stage S1 of two stages S1, S2. Since the first stage S1 is positioned further from region of interest RoI than the second stage S2, there is a reduced risk of a volume conflict between a reference detector provided in the beam path of the diffraction radiation portion RP and the beam path of the specularly reflected radiation portion RP. Optionally, a folding reflector fm may still be provided in the beam path of the radiation diffracted by the reference grating G in the embodiments of FIGS. 7(b), 7(d) and 8.

Since there is only one stage S1 in the embodiment of FIG. 13, there is an increased risk of a volume conflict due to the proximity of the first stage S1 to the substrate W. Providing a folding reflector fm in the beam path of the diffraction radiation portion DP may reduce the risk of a volume conflict in single stage optical systems OS. In the particular arrangement depicted by FIG. 13, it can be seen that providing the folding reflector fm allows the reference detector 714 to be positioned so as to avoid a volume conflict between the reference detector 714, the reflected radiation portion RP and/or the substrate W.

Although FIG. 13 depicts the reference grating G as extending across the entire reflective surface of the second reflector m2, it will be appreciated that in some embodiments, the reference grating G may be provided as only part of the reflective surface of the second reflector m2. In other words, the reference grating G may not extend across the entire reflective surface of the reflector so that only a partial cross-section of the beam of radiation B is sampled for monitoring by the reference detector 714. Although FIG. 13 depicts a single stage optical system OS, it will be appreciated that the reference grating G, and optionally the folding reflector fm, could be provided as part of any stage or reflector of any optical system OS described herein. It will be appreciated that at least one reference grating G may be provided as part of one or more reflectors of any optical system OS described herein.

Further embodiments are disclosed in the subsequent numbered clauses:

1. An optical system for focusing a beam of radiation on a region of interest in a metrology apparatus, the beam of radiation comprising radiation in a soft X-ray or Extreme Ultraviolet spectral range, the optical system comprising:
    a first stage for focusing the beam of radiation at an intermediate focus region; and
    a second stage for focusing the beam of radiation from the intermediate focus region onto the region of interest, wherein the second stage comprises a Kirkpatrick-Baez reflector combination.
2. An optical system according to clause 1, wherein the first stage comprises a Kirkpatrick-Baez reflector combination.
3. An optical system according to clause 1 or 2, wherein the optical system is configured to focus the beam of radiation on the region of interest of a substrate so that information regarding the region of interest is determinable from radiation that is at least one of: reflected, scattered and diffracted from the region of interest.
4. An optical system according to clause 1, 2 or 3, wherein at least one of the first stage and second stage comprises a diffractive element for spatially separating diffracted spectral components of the beam of radiation.
5. An optical system according to clause 4, wherein the diffractive element is provided as part of a reflector of at least one of the first stage and the second stage, and optionally wherein the diffractive element is provided as part of the first stage, and optionally wherein the diffractive element is provided as part of a first reflector of the first stage.
6. An optical system according to any one of clauses 1 to 5, wherein a pathlength of a chief ray defined between the intermediate focus region and the region of interest is less than or equal to 3 meters.
7. An optical system according to any one of clauses 1 to 6, wherein at least one of: the first stage and the second stage comprise an aberration-correcting reflector.
8. An optical system according to clause 7, wherein at least one reflector of the Kirkpatrick-Baez reflector combination of the second stage comprises the aberration-correcting reflector.
9. An optical system according to clause 7 or 8, wherein the aberration-correcting reflector is configured such that, in use, rays of the beam of radiation incident on different portions of the aberration-correcting reflector are focused by at least one of: the first stage and second stage to a substantially aberration-free focal spot.
10. An optical system according to clause 7, 8 or 9, wherein a surface profile of a reflective surface of the aberration-correcting reflector has a substantially elliptic-cylindrical shape and the surface profile has deviations from the elliptic-cylindrical shape, the deviations being configured to obtain a substantially aberration-free focal spot.
11. An optical system according to any one of the clauses 7 to 10,
    wherein a portion, optionally at least 80%, of the surface profile of reflective surface is symmetrical with respect to a symmetry plane and the symmetry plane is defined where a first intersection between the symmetry plane and the surface profile is a first portion of a first ellipse,
    wherein further intersections are defined between the surface profile and other planes, the other planes are parallel to the symmetry plane and the other planes are not intersecting with the symmetry plane, the further intersections are not exactly equal to any portion of any ellipse,
    wherein, with increasing distances between the other planes at one hand and the symmetry plane at the other hand, the further intersections increasingly diverge from the first portion of the first ellipse.
12. An optical system according to clause 11, wherein the surface profile has a straight line where the line is perpendicular to the symmetry plane and follows the surface profile.
13. An optical system according to clause 12,
    wherein a local Cartesian coordinate system uvw is defined with an origin at a point where the straight line intersects with the symmetry plane, the w axis coincides with a normal to the reflective surface at the origin, the v axis coincides with the straight line and the u axis is perpendicular to the v and w axis,
    wherein a w coordinate of the surface profile is defined by $$w = E_1(u) + c_o v^2 + c_1 u v^2 + c_2 u^2 v^2$$

where $E_1(u)$ defines the first portion of the first ellipse of the first intersection, and $c_o$, $c_1$, $c_2$ are coefficients and at least one of the coefficients $c_o$, $c_1$, $c_2$ is not equal to 0 and, optionally, at least coefficient c2 is not equal to 0.
14. An optical system according to clause 13, wherein the divergence of the further intersections with the first portion of the first ellipse correlates more with $c_2 u^2 v^2$ than with $c_0 v^2 + c_1 u v^2$.
15. An optical system according to any one of clauses 1 to 14, wherein at least one reflector of the first stage comprises at least one of: an elliptic-cylindrical reflector; and a parabolic-cylindrical reflector.
16. An optical system according to any one of clauses 1 to 15, wherein the first stage comprises at least one of: a first reflector and a second reflector.
17. An optical system according to clause 16, wherein the first reflector of the optical system is oriented such that a chief ray of the beam of radiation has a grazing angle of incidence on the first reflector of greater than or equal to 1 degree.
18. An optical system according to any one of clauses 1 to 17, wherein the second stage comprises an additional reflector and a further additional reflector.
19. An optical system according to clause 18, wherein the additional reflector of the optical system is oriented such that a chief ray of the beam of radiation has a grazing angle of incidence on the additional reflector of greater than or equal to 5 degrees.
20. An optical system according to any one of clauses 1 to 19, wherein at least one of: the first stage and the second stage is configured to receive the beam of radiation where the beam of radiation has a divergence half-angle of greater than or equal to 1 mrad.
21. An optical system according to any one of clauses 1 to 20, wherein a pathlength of a chief ray defined between an apparent source of the beam of radiation and the region of interest is less than or equal to 3 meters.
22. An optical system according to any one of clauses 1 to 21, wherein the first stage comprises a first reflector and a second reflector and the second stage comprises an additional reflector and a further additional reflector, wherein extending from a point (P1) of the optical system, four different rays (AR, BR, aR, bR) of the beam of radiation are defined such that:
 the four different rays (AR, BR, aR, bR) are close to a chief ray of the beam of radiation;
 a first plane between the point (P1) and the first reflector comprises the rays AR and aR and a second plane between the point (P1) and the first reflector comprises the rays BR and bR, the first plane and the second plane being perpendicular to each other with the chief ray propagating along an intersection line between the first plane and the second plane;
 the rays AR and aR are approximately in a meridional plane of the first reflector and the rays BR and bR are approximately in a meridional plane of the second reflector such that the ray AR or BR is the ray with the shortest distance from the point (P1) to the first reflector or second reflector, respectively, and such that the ray aR or bR is the ray with the longest distance from the point (P1) to the first reflector or second reflector, respectively,
 wherein an orientation of each of the reflectors is defined by the ray that travels the shortest distance from the point (P1) to the respective reflector such that, by definition, the first reflector is in an A configuration and the second reflector is in a B configuration, thereby defining the first stage as an AB configuration, and
 wherein an orientation of the additional reflector and further additional reflector is configured in one of the following configurations with the shortest distance from the point (P1) to the respective reflector of the second stage:
 AB, Ab, aB, ab, BA, Ba, bA, ba.
23. An optical system according to clause 22, wherein the respective orientation of the additional reflector and further additional reflector is defined by the ba configuration.
24. An optical system according to any one of clauses 16 to 21, wherein the first stage comprises the first reflector.
25. An optical system according to clause 24, wherein the first reflector comprises an elliptic-cylindrical reflector.
26. An optical system according to clause 24 or 25, wherein the second stage comprises an additional reflector and a further additional reflector, wherein extending from a point (P1) of the optical system, four different rays (AR, BR, aR, bR) of the beam of radiation are defined such that:
 the four different rays (AR, BR, aR, bR) are close to a chief ray of the beam of radiation;
 a first plane between the point (P1) and the first reflector comprises the rays AR and aR and a second plane between the point (P1) and the first reflector comprises the rays BR and bR, the first plane and the second plane being perpendicular to each other with the chief ray propagating along an intersection line between the first plane and the second plane;
 the rays AR and aR are approximately in a meridional plane of the first reflector such that the ray AR is the ray with the shortest distance from the point (P1) to the first reflector, and such that the ray aR is the ray with the longest distance from the point (P1) to the first reflector,
 wherein an orientation of each of the reflectors is defined by the ray that travels the shortest distance from the point (P1) to the respective reflector such that, by definition, the first reflector is in an A configuration, thereby defining the first stage as an A configuration, and
 wherein an orientation of the additional reflector and further additional reflector is configured in one of the following configurations with the shortest distance from the point (P1) to the respective reflector of the second stage:
 AB, Ab, aB, ab, BA, Ba, bA, ba.
27. An optical system according to clause 26, wherein the respective orientation of the additional reflector and further additional reflector is defined by the AB configuration.
28. An optical system according to any one of clauses 1 to 27, wherein the optical system is configured to de-magnify the beam of radiation such that there is a different demagnification of the beam of radiation at the region of interest in a meridional plane and a sagittal plane.
29. An optical system according to any one of clauses 1 to 28, wherein a numeral aperture defined between the second stage and the region of interest is greater than or equal to 0.005.
30. A metrology or inspection apparatus comprising
 a substrate table for receiving and holding a substrate at a controllable position,
 a radiation source for generating a beam of illumination radiation,
 an optical system according to any one of clauses 1 to 29 for focusing the beam of illumination radiation at a region of interest on the substrate.
31. A method of using an optical system for focusing a beam of radiation on a region of interest in a metrology apparatus, the beam of radiation comprising radiation in a soft X-ray or Extreme Ultraviolet spectral range, the method comprising:
 providing a first stage for focusing the beam of radiation at an intermediate focus point;
 providing a second stage for focusing the beam of radiation from the intermediate focus point onto the region of interest, wherein the second stage comprises a Kirkpatrick-Baez reflector combination; and
 focusing the beam of radiation on the region of interest.
32. A reflector for correcting aberration in an optical system for focusing a beam of radiation on a region of interest in a metrology apparatus, the beam of radiation comprising radiation in a soft X-ray or Extreme Ultraviolet spectral range, wherein a surface profile of a reflective surface of the reflector has a substantially elliptic-cylindrical shape and the surface profile has deviations from the elliptic-cylindrical shape, the deviations being configured to obtain an aberration-free focal spot.
33. A reflector according to clause 32,
 wherein a portion, optionally at least 80%, of the surface profile of the reflective surface is symmetrical with respect to a symmetry plane and the symmetry plane is defined where a first intersection between the symmetry plane and the surface profile is a first portion of a first ellipse,
wherein further intersections are defined between the surface profile and other planes, the other planes are parallel to the symmetry plane and the other planes are not intersecting with the symmetry plane, the further intersections are not exactly equal to any portion of any ellipse,
wherein, with increasing distances between the other planes at one hand and the symmetry plane at the other hand, the further intersections increasingly diverge from the first portion of the first ellipse.

34. A reflector according to clause 33, wherein the surface profile has a straight line where the line is perpendicular to the symmetry plane and follows the surface profile.

35. A reflector according to clause 34,
wherein a local Cartesian coordinate system uvw is defined with an origin at a point where the straight line intersects with the symmetry plane, the w axis coincides with a normal to the reflective surface at the origin, the v axis coincides with the straight line and the u axis is perpendicular to the v and w axis,
wherein a w coordinate of the surface profile is defined by $$w = E_1(u) + c_o v^2 + c_1 uv^2 + c_2 u^2 v^2$$

where $E_1(u)$ defines the first portion of the first ellipse of the first intersection, and $c_o$, $c_1$, $c_2$ are coefficients and at least one of the coefficients $c_o$, $c_1$, $c_2$ is not equal to 0 and, optionally, at least coefficient c2 is not equal to 0.

36. A reflector according to clause 35, wherein the divergence of the further intersections with the first portion of the first ellipse correlates more with $c_2 u^2 v^2$ than with $c_o v^2 + c_1 uv^2$.

37. A method of manufacturing a reflector for correcting aberration in an optical system for focusing a beam of radiation on a region of interest in a metrology apparatus, the beam of radiation comprising radiation in a soft X-ray or Extreme Ultraviolet spectral range, wherein the method comprises:
forming a surface profile of a reflective surface of a reflector to have a substantially elliptic-cylindrical shape and such that the surface profile has deviations from the elliptic-cylindrical shape, the deviations being configured to obtain an aberration-free focal spot.

38. A method of correcting aberration in an optical system for focusing a beam of radiation on a region of interest in a metrology apparatus, the beam of radiation comprising radiation in a soft X-ray or Extreme Ultraviolet spectral range, wherein the method comprises:
providing a reflector, wherein a surface profile of a reflective surface of the reflector has a substantially elliptic-cylindrical shape and the surface profile has deviations from the elliptic-cylindrical shape, the deviations being configured to obtain an aberration-free focal spot; and
correcting for aberration in the optical system using the reflector.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Although specific reference is made in this text to "metrology apparatus", this term may also refer to an inspection apparatus or an inspection system. E.g. the inspection apparatus that comprises an embodiment of the invention may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

In the context of the above document the term HHG or HHG source is introduced. HHG refers to High Harmonic Generation or sometimes referred to as high order harmonic generation. HHG is a non-linear process in which a target, for example a gas, a plasma or a solid sample, is illuminated by an intensive laser pulse. Subsequently, the target may emit radiation with a frequency that is a multiple of the frequency of the radiation of the laser pulse. Such frequency, that is a multiple, is called a harmonic of the radiation of the laser pulse. One may define that the generated HHG radiation is a harmonic above the fifth harmonic and these harmonics are termed high harmonics. The physical process that forms a basis of the HHG process is different from the physical process that relates to generating radiation of the lower harmonics, typically the 2nd to 5th harmonic. The generation of radiation of the lower harmonic relates to perturbation theory. The trajectory of the (bound) electron of an atom in the target is substantially determined by the Coulomb potential of the host ion. In HHG, the trajectory of the electron that contributes to the HHG process is substantially determined by the electric field of the incoming laser light. In the so-called "three step model" describing HHG, electrons tunnel through the Coulomb barrier which is at that moment substantially suppressed by the laser field (step 1), follow a trajectory determined by the laser field (step 2) and recombine with a certain probability while releasing their kinetic energy plus the ionization energy in the form of radiation (step 3). Another way of phrasing a difference between HHG and the generation of radiation of the lower harmonic is to define that all radiation with photon energy above the ionization energy of the target atoms as "High Harmonic" radiation, e.g. HHG generated radiation, and all radiation with photon energy below the ionization energy as non-HHG generated radiation. If Neon is used as a gas target, all radiation with a wavelength shorter than 62 nm (having a photon energy higher than 20.18 eV) is generated by means of the HHG process. For Argon as a gas target, all radiation having a photon energy higher than about 15.8 eV is generated by means of the HHG process.

Throughout this disclosure and where appropriate, the term "reflected radiation" may be considered to refer to "specularly reflected radiation". Throughout this disclosure and where appropriate, the term "diffracted radiation" may be considered to refer to 1st or higher-diffraction-order radiation.

Some embodiments described herein refer to an optical system OS comprising first, second and third reflectors, m1, m2 and m3. In such embodiments, the second and third reflectors m2 and m3 may respectively refer to examples of an additional reflector and a further additional reflector. Some embodiments described herein refer to an optical system OS comprising first, second, third and fourth reflectors, m1, m2, m3 and m4. In such embodiments, the third and fourth reflectors m3 and m4 may respectively refer to examples of an additional reflector and a further additional reflector.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An optical system for focusing a beam of radiation on a region of interest in a metrology apparatus, the beam of radiation comprising radiation in a soft X-ray or Extreme Ultraviolet spectral range, the optical system comprising:
    a first stage configured to focus the beam of radiation at an intermediate focus region; and
    a second stage configured to focus the beam of radiation from the intermediate focus region onto the region of interest, wherein the second stage comprises a Kirkpatrick-Baez reflector combination.

2. The optical system of claim 1, wherein the first stage comprises a Kirkpatrick-Baez reflector combination.

3. The optical system of claim 1, wherein the optical system is configured to focus the beam of radiation on the region of interest of a substrate so that information regarding the region of interest is determinable from radiation that is reflected, scattered, or diffracted from the region of interest.

4. The optical system of claim 1, wherein:
    at least one of the first stage and second stage comprises a diffractive element configured to spatially separate diffracted spectral components of the beam of radiation, wherein the diffractive element is provided as: part of a reflector of at least one of the first stage and the second stage, part of the first stage, or as part of a first reflector of the first stage.

5. The optical system of claim 1, wherein a path length of a chief ray defined between the intermediate focus region and the region of interest is less than or equal to about 3 meters.

6. The optical system of claim 1, wherein:
    at least one of the first stage and the second stage comprise an aberration-correcting reflector, and
    at least one reflector of the Kirkpatrick-Baez reflector combination of the second stage comprises the aberration-correcting reflector.

7. The optical system of claim 6, wherein the aberration-correcting reflector is configured such that, in use, rays of the beam of radiation incident on different portions of the aberration-correcting reflector are focused by at least one of the first stage and second stage to a substantially aberration-free focal spot.

8. The optical system of claim 6, wherein a surface profile of a reflective surface of the aberration-correcting reflector has a substantially elliptic-cylindrical shape and the surface profile has deviations from the elliptic-cylindrical shape, the deviations being configured to obtain a substantially aberration-free focal spot.

9. The optical system of claim 6,
    wherein a portion, at least 80%, of the surface profile of reflective surface is symmetrical with respect to a symmetry plane and the symmetry plane is defined wherein a first intersection between the symmetry plane and the surface profile is a first portion of a first ellipse;
    wherein further intersections are defined between the surface profile and other planes, the other planes are parallel to the symmetry plane and the other planes are not intersecting with the symmetry plane, the further intersections are not exactly equal to any portion of any ellipse; and,
    wherein, with increasing distances between the other planes at one hand and the symmetry plane at the other hand, the further intersections increasingly diverge from the first portion of the first ellipse.

10. The optical system of claim 1, wherein at least one reflector of the first stage comprises an elliptic-cylindrical reflector or a parabolic-cylindrical reflector.

11. A metrology or inspection apparatus comprising:
    a substrate table configured to receive and hold a substrate at a controllable position,
    a radiation source configured to generate a beam of illumination radiation, and
    an optical system configured to:
        focus a beam of radiation on a region of interest in a metrology apparatus, the beam of radiation comprising radiation in a soft X-ray or Extreme Ultraviolet spectral range, the optical system comprising:
            a first stage configured to focus the beam of radiation at an intermediate focus region; and
            a second stage configured to focus the beam of radiation from the intermediate focus region onto the region of interest, wherein the second stage comprises a Kirkpatrick-Baez reflector combination; and
        focus the beam of illumination radiation at a region of interest on the substrate.

12. A method of using an optical system for focusing a beam of radiation on a region of interest in a metrology apparatus, the beam of radiation comprising radiation in a soft X-ray or Extreme Ultraviolet spectral range, the method comprising:
    providing a first stage configured to focus the beam of radiation at an intermediate focus point;
    providing a second stage configured to focus the beam of radiation from the intermediate focus point onto the region of interest, wherein the second stage comprises a Kirkpatrick-Baez reflector combination; and
    focusing the beam of radiation on the region of interest.

13. A reflector for correcting aberration in an optical system for focusing a beam of radiation on a region of interest in a metrology apparatus, the beam of radiation comprising radiation in a soft X-ray or Extreme Ultraviolet spectral range, wherein a surface profile of a reflective surface of the reflector has a substantially elliptic-cylindrical shape and the surface profile has deviations from the elliptic-cylindrical shape, the deviations being configured to obtain an aberration-free focal spot.

14. A method of manufacturing a reflector for correcting aberration in an optical system for focusing a beam of radiation on a region of interest in a metrology apparatus, the beam of radiation comprising radiation in a soft X-ray or Extreme Ultraviolet spectral range, wherein the method comprises:

forming a surface profile of a reflective surface of a reflector to have a substantially elliptic-cylindrical shape, such that the surface profile has deviations from the elliptic-cylindrical shape, the deviations being configured to obtain an aberration-free focal spot.

15. A method of correcting aberration in an optical system for focusing a beam of radiation on a region of interest in a metrology apparatus, the beam of radiation comprising radiation in a soft X-ray or Extreme Ultraviolet spectral range, wherein the method comprises:

providing a reflector, wherein a surface profile of a reflective surface of the reflector has a substantially elliptic-cylindrical shape and the surface profile has deviations from the elliptic-cylindrical shape, the deviations being configured to obtain an aberration-free focal spot; and correcting for aberration in the optical system using the reflector.

\* \* \* \* \*